United States Patent
Bi et al.

(10) Patent No.: US 11,170,304 B1
(45) Date of Patent: Nov. 9, 2021

(54) BAD DATA DETECTION ALGORITHM FOR PMU BASED ON SPECTRAL CLUSTERING

(71) Applicant: NORTH CHINA ELECTRIC POWER UNIVERSITY, Beijing (CN)

(72) Inventors: Tianshu Bi, Beijing (CN); Hao Liu, Beijing (CN); Zhiwei Yang, Beijing (CN); Ke Jia, Beijing (CN)

(73) Assignee: North China Electric Power University, Beijing (CN)

( * ) Notice: Subject to any disclaimer, the term of this patent is extended or adjusted under 35 U.S.C. 154(b) by 0 days.

(21) Appl. No.: 17/215,724

(22) Filed: Mar. 29, 2021

Related U.S. Application Data

(63) Continuation of application No. PCT/CN2021/077901, filed on Feb. 25, 2021.

(51) Int. Cl.
  *G06K 9/62* (2006.01)
  *G06N 5/00* (2006.01)
  *G01R 19/25* (2006.01)

(52) U.S. Cl.
  CPC ......... *G06N 5/003* (2013.01); *G01R 19/2513* (2013.01); *G06K 9/6215* (2013.01); *G06K 9/6223* (2013.01); *G06K 9/6235* (2013.01)

(58) Field of Classification Search
  CPC .. G06N 5/003; G01R 19/2513; G06K 9/6215; G06K 9/6223; G06K 9/6235
  See application file for complete search history.

(56) References Cited

U.S. PATENT DOCUMENTS

2020/0327264 A1* 10/2020 Wang ..................... G06N 7/005

OTHER PUBLICATIONS

Raak et al, "Data-Driven Partitioning of Power Networks Via Koopman Mode Analysis", 2016, IEEE Transactions On Power Systems, vol. 31, No. 4, pp. 2799-2808 (10 pages) (Year: 2016).*
Yang, Zhiwei et al., "Bad Data Detection Algorithm for PMU Based on Spectral Clustering" Journal of Modern Power Systems and Clean Energy, vol. 8, No. 3, pp. 473-483, May 2020.

* cited by examiner

*Primary Examiner* — David F Dunphy
(74) *Attorney, Agent, or Firm* — Hunton AK, LLP

(57) ABSTRACT

A data-driven PMU bad data detection algorithm based on spectral clustering using single PMU data is described. The described algorithm does not require the system topology and parameters. First, a data identification method based on a decision tree is described to distinguish event data and bad data by using the slope feature of each set of data. Then, a bad data detection method based on spectral clustering is described. By analyzing the weighted relationships among all the data, this method can detect the bad data that has a small deviation.

1 Claim, 18 Drawing Sheets

(a) Relationship between $\varepsilon$ and accuracy (b) Relationship between $p$ and accuracy

BAD DATA DETECTION ALGORITHM FOR PMU BASED ON SPECTRAL CLUSTERING

BACKGROUND

Phasor measurement units (PMUs) can provide real-time measurement data to construct the ubiquitous power of the Internet of Things.

SUMMARY

Due to complex factors on-site, PMU data can be easily compromised by interference or synchronization jitter, resulting in varying levels of PMU data quality issues, which can directly affect the PMU-based application and even threaten the safety of power systems. In order to improve the PMU data quality, a data-driven PMU bad data detection algorithm based on spectral clustering using single PMU data is described in this disclosure. The described algorithm does not require the system topology and parameters. First, a data identification method based on a decision tree is described to distinguish event data and bad data by using the slope feature of each data. Then, a bad data detection method based on spectral clustering is disclosed. By analyzing the weighted relationships among all the data, this method can detect the bad data that has a small deviation. Simulations and field recorded data testing results illustrate that this data-driven method can achieve bad data identification and detection effectively. This technique can improve PMU data quality to guarantee its applications in the power systems.

BRIEF DESCRIPTION OF THE DRAWINGS

In order to facilitate a fuller understanding of the present invention, reference is now made to the attached drawings. The drawings should not be construed as limiting the present invention, but are intended only to illustrate different aspects and embodiments of the invention.

DETAILED DESCRIPTION

Figure 1:
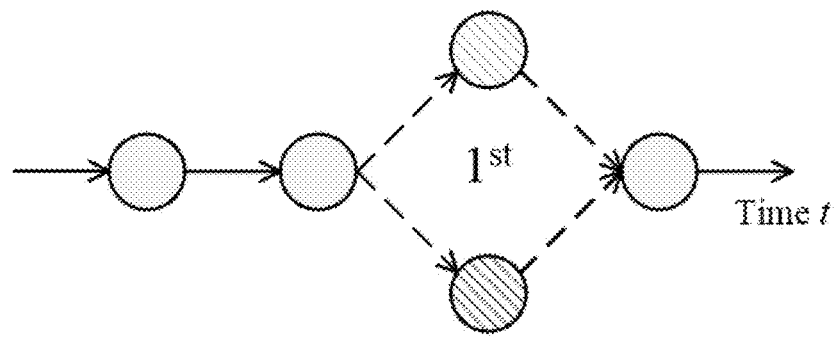
FIG. 1 shows an example schematic of possible bad data.
Figure 1:
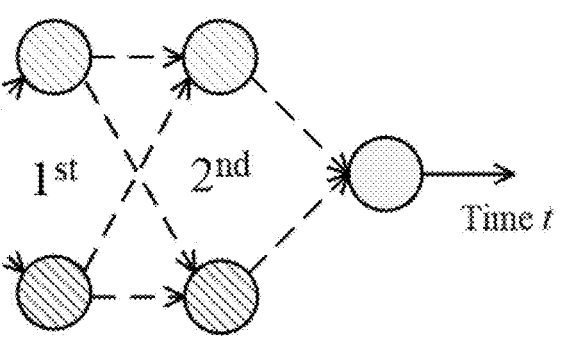
Figure 1:
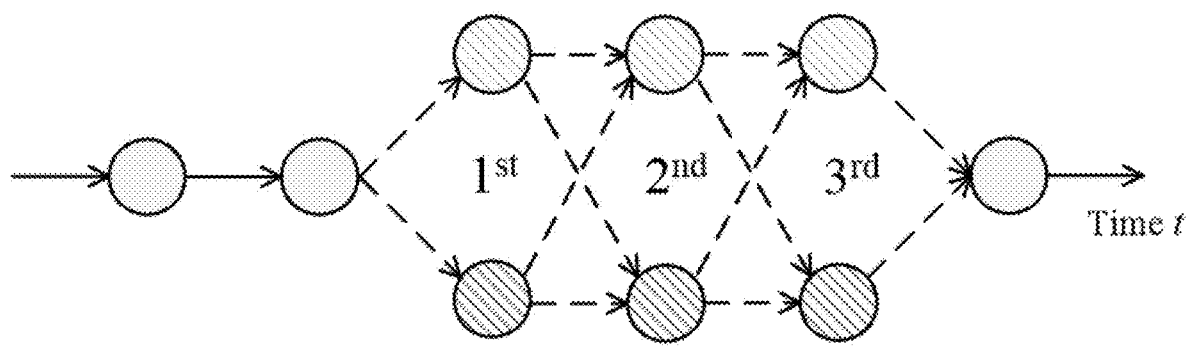

Exemplary embodiments of the invention will now be described in order to illustrate various features of the invention. The embodiments described herein are not intended to be limiting as to the scope of the invention, but rather are intended to provide examples of the components, use, and operation of the invention.

I. Introduction

Phasor measurement units (PMUs) have become an important mechanism used in the ubiquitous power of the Internet of Things to achieve state perception, due to their rapidity, synchronism, and accuracy. Furthermore, PMUs can provide real-time phasor time data for critical power system applications such as remedial action schemes, oscillation detection, and state estimation. Up to 2018, approximately 3000 PMUs were installed and put into operation in China, covering the majority of 220 kV and above substations, main power plants, and grid-connected renewable energy collections. In addition, in 2017, it is reported that around 2500 commercial PMUs have been installed in North America.

However, in view of the complex factors on-site, PMU data is vulnerable to many corrupting factors. For example, a jitter of GPS signal can cause phase angle deviation. It is also possible that PMU data may have a spike due to an interference, or a data transmission mistake. Such issues lead to varying degrees of data quality issues in PMU data. According to the 2011 Five-Year Plan issued by the California Independent System Operator (ISO), around 10% to 17% of PMU data in North America is corrupted. Around 20-30% of PMU data in China has data quality problems. Data quality issues make the system less observable, affect the performance of state estimation and parameter identification based on PMUs, and even threaten the safe and stable operation of power systems. Detection of PMU bad data has become a critical issue and plays an important role in improving data quality and ensuring accurate state perception.

Various methods have been proposed to detect bad data in the power systems. There is an approach for identifying measurement errors in DC power flow by exploiting the singularity of the impedance matrix and the sparsity of the error vector. This approach leverages the structure of the power system and can compute the measurement errors accurately. There is also a bad data detection method based on state estimation. The phasor-measurement-based state estimator improves data consistency by identifying angle biases and current scaling errors. A time-series prediction model combined with Kalman filtering and smoothing algorithm to clean the bad data has been considered. Some propose a method based on the unscented Kalman filter in conjunction with a state estimation algorithm to detect bad data in real-time. Bad data from failing current transformers can be detected by a linear weighted least square-based state estimation algorithm. Some propose a robust generalized estimator to detect bad data by exploiting the temporal correlation and the statistical consistency of measurements. Both state estimator and Kalman filter method require system topology and line parameters with multiple PMU measurements. The results of both methods will, therefore, be affected in cases where an error exists in the topology or parameter of the system.

Scholars have also proposed data-driven methods to detect data anomaly. Traditional methods for bad data detection are based on the format of the sent data in the protocol. Some have developed a selection of detection criteria based on logical judgments. If the data exceeds the set threshold, it is considered to be bad data. However, if there is a large disturbance in the power system, the specific threshold set in advance may lose meaning. Some use measurement information in multiple PMUs along with an online data-driven approach for the detection of low-quality phasor measurements based on spatiotemporal similarities among multiple-time-instant synchrophasor measurements. Similarly, the low-rank property of the matrix and the sparsity of the anomalies are used to detect bad data, a method based on principal component analysis is proposed to separate signals into low-dimensional feature components and high-dimensional noise components for bad data detection. These methods utilize multiple PMU measurement information to achieve bad data detection.

In some areas, only a small number of PMUs are present and so multiple PMU measurement information is difficult to obtain and single PMU measurement can only be relied on to achieve detection. Some have developed an ensemble learning algorithm based on a single PMU with three simple models to detect anomaly data. An alternative density-based clustering method is proposed to cluster the phasor data to detect bad data for classification. Some use machine learning techniques based on the support vector machine for bad detection. These methods are based on a single PMU, and when data is present during events such as step data, such methods may not be suitable.

In this disclosure, a data-driven PMU bad data detection algorithm by a single PMU measurement is described which is based on spectral clustering. In order to distinguish event data from bad data, a bad data and event data identification method based on a decision tree is first developed which utilizes the slope feature of each data. Then a subsequent bad data detection method based on spectral clustering is described, which can detect bad data with small deviation values by the weight among data. The described algorithm does not require the system topology and parameters. It can avoid the misjudgment of event data. The feasibility and accuracy of the described method are verified through simulations and field recorded data. The results show this data-driven method can achieve bad data identification and detection effectively. It can provide data guarantee for better application of PMU data.

II. Bad Data and Event Data Identification Method

A. Features of Bad Data and Event Data

This disclosure mainly studies the PMU bad data which is affected by interference or jitter. These types of bad data deviate from the normal values. By analyzing a large amount of field data, most of the bad data exists alone and the number of contiguous bad data is no more than three. It is also pointed that the outliers are all isolated and not in sequence. Meanwhile, the amplitude is taken as an example to introduce this method, which can be applied to amplitude, frequency, and rate of change of frequency, where the amplitude includes voltage amplitude and current amplitude. But this method is not suitable for the phase angle because when the frequency is offset, the phase angle changes from −180 deg to 180 deg.

To study the identification of bad data and event data, the features of such data must be analyzed. FIG. 1 shows an example schematic of possible bad data. The schematic in FIG. 1 includes some bad data in the steady state. The gray circle represents normal data while the shadowed circle represents bad data. The blue shadowing shows anomaly data with higher amplitude and the red shadowing is anomaly data with a smaller amplitude. The number of contiguous bad data may be one, two, and three as shown in FIGS. 1a, 1b, and 1c, respectively. Taking FIG. 1a as an example, two possibilities of bad data can be seen in which the amplitude may be larger or smaller than normal value. Similarly, the possibilities in FIG. 1b and FIG. 1c are four and eight, respectively.

Figure 2:
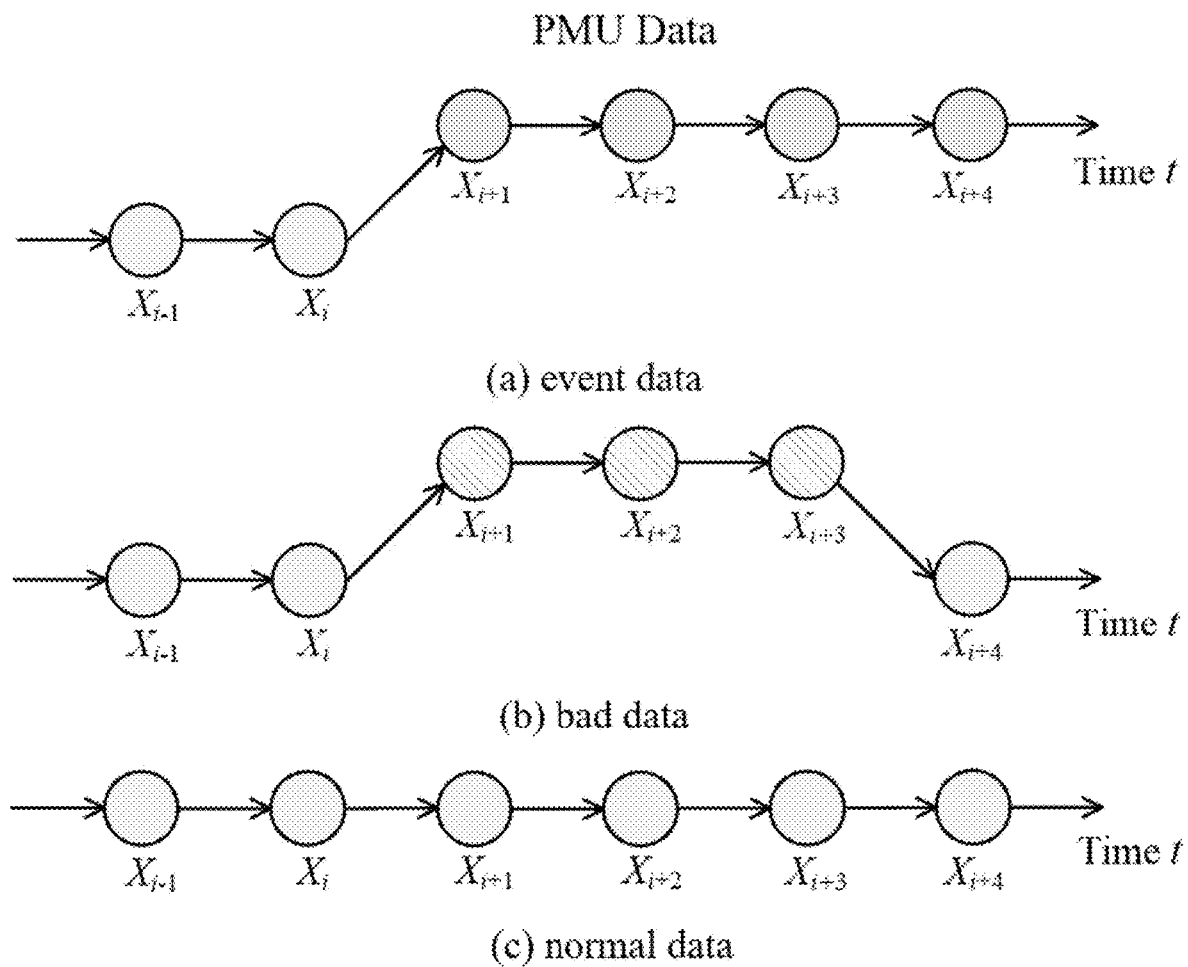
FIG. 2 shows an example comparison between event data, bad data, and normal data.

For the purpose of avoiding misjudgment of event data, a comparison is carried out between event data, bad data, and normal data. FIG. 2 shows an example comparison between event data, bad data, and normal data. In FIG. 2, $|X_i|$ is the amplitude of each data. As shown in FIG. 2a, when $t=t_{i+1}$, the amplitude step occurs and the yellow circle represents step data. The data $X_i$ is defined as a step point, in which the data before $X_i$ and the data after $X_{i+1}$ can be both considered as normal data. FIG. 2b represents the possibility of three contiguous bad data events. The blue shadowed circle represents bad data whose amplitudes are higher than the normal value and close to each other. Additionally, FIG. 2c represents the normal data. According to the comparison, the difference between event data and bad data is the number of contiguous data points with close amplitudes. In this case, the number of event data is more than three and the number of contiguous bad data is three or less. Thus, the method is able to distinguish them based on the features of four contiguous data.

The slope of each data $k_i$ is calculated by (1).

$$k_i = \left| \frac{|X_{i+1}| - |X_i|}{t_{i+1} - t_i} \right| \tag{1}$$

When the power system is in normal operation, the data is ambient data with a small slope. However, when there is event data or bad data, the amplitude changes and the slopes become larger. A comparison of the slope of event data and bad data in FIG. 2 is provided in Table I.

TABLE I

COMPARISON OF SLOPE VALUES OF EVENT DATA, BAD DATA, AND NORMAL DATA

| Data type | $k_i$ | $k_{i+1}$ | $k_{i+2}$ | $k_{i+4}$ |
| --- | --- | --- | --- | --- |
| Event data | Large | Small | Small | Small |
| Bad data | Large | Small | Small | Large |
| Normal data | Small | Small | Small | Small |

It can be seen from Table I that the slopes are large, small, small, and small when starting from the step point X. The contiguous four-point slope of normal data or bad data does not change in this manner. Therefore, the slopes of four contiguous data from the step point have a unique feature that can be used to detect when the step occurs.

When the amplitude step occurs, it is difficult to calculate the value of the amplitude step without the parameter of lines. This means it is difficult to determine the threshold of the slope value of the step point. Using the threshold judgment method to detect the step point is hard. Therefore, this disclosure proposes an identification method based on decision tree first, which avoids the subjectivity of artificially setting thresholds through the training of a large amount of field data. On this basis, the bad data is further detected. When the system oscillates, the identification method is still applicable, and this process is verified in Section IV.

B. Construction of Decision Tree

The identification of the event data and non-event data can be equivalent to a binary classification issue. A machine learning method based on the C4.5 decision tree is an effective tool to solve this problem. This tool works well as it uses the information gain ratio to select features rather than the information gain in the ID3 algorithm, avoiding the preference for features with more values. Also, there are many other similar machine learning algorithms like the random forest, pre-pruning decision tree and classification, and regression tree, etc. The random forest consists of multiple decision trees. It has obvious advantages when dealing with large sample or high-dimensional feature data. In this disclosure, the sample data in the identification problem is small. There is no need to use the random forest algorithm. The pre-pruning decision tree can reduce training time and test time. However, the branches of the tree constructed by C4.5 are only 4. Therefore, it does not need pre-pruning which might cause under-fitting. The classification and regression tree (CART) selects the best features by the Gini index, which is better for large sample data. In this disclosure, the sample data is small. The CART method is not necessary. Furthermore, a large number of simulations and field tests have proved that the C4.5 method has enough high accuracy, which can be seen in Section IV.

As shown in FIG. 2a, the label of step point is l=1, while the others are l=0. The features of each data point are the slope values of the contiguous four data points including it, such as ($k_i$, $k_{i+1}$, $k_{i+2}$, $k_{i+3}$). Thus, there are a total of four features of each data point, recorded as (a=$k_i$, c=$k_{i+2}$, d=$k_{i+3}$). The decision tree construction is then performed using a large amount of field data. In this method, 80% of all the data is randomly selected as the training set D including the event data and non-event data. 20% of the data is the test set D' like that. The training data is used to construct a decision tree. The test data is used to verify its accuracy. The detailed steps are as followed.

The total information entropy of the training data D is calculated by:

$$Z(D) = -\sum_{i=1}^{2} z_i \log_2 z_i \quad (2)$$

where $z_1$ indicates the proportion of step point in D, $z_2$ indicates the proportion of non-step point in D, and Z(D) is the uncertainty of the data label. The information entropy is one of the most commonly used indicators for measuring the purity of a sample.

Assume that the feature b is first selected to partition D, and the feature b is discretized by dichotomy. Meanwhile, there are j different values in feature b, and divide these values from small to large to form a collection {$b_1$, $b_2$, ..., $b_j$}. Set the median point of each interval [$b_i$, $b_{i+1}$) as the split point $s_i$. A split point collection S can be calculated by (3).

$$S = \left\{ s_i = \frac{b^i + b^{i+1}}{2} \,\middle|\, 1 \leq i \leq j-1 \right\} \quad (3)$$

Each split point can divide the training data D into subsets $D_s^-$ and $D_s^+$. $D_s^-$ represents the collection of training data whose $b_i \leq s_i$, and $D_s^+$ represents the collection of the training data whose $b_i > s_i$. The information gain of s is calculated:

$$O(D, b, s_i) = Z(D) - \frac{|D_{s_i}^-|}{|D|} Z(D_{s_i}^-) - \frac{|D_{s_i}^+|}{|D|} Z(D_{s_i}^+) \quad (4)$$

where |D| represents the number of data, $|D_s^-|/|D|$ is the weight of the data whose feature $s_i$, and $|D_s^+|/|D|$ represents the weight of the data whose feature $b_i > s_i$. The larger the information gain O is, the better effect the split point $s_i$ has. Due to the ID3 algorithm select the maximum information gain, which has a preference for features with more values, the C4.5 decision tree defines the gain ratio to select the optimal feature. The definition is as follows:

$$o(D, b, s_i) = \frac{O(D, b, s_i)}{I(b)} \quad (5)$$

$$I(b) = -\sum_{\beta \in \{-,+\}} \frac{|D_{s_i}^\beta|}{|D|} \log_2 \frac{|D_{s_i}^\beta|}{|D|} \quad (6)$$

where I(b) is the intrinsic value.

Select the maximum of gain ratio o(D, b, $s_i$) as the gain ratio of the feature b. Therefore, select the split point $s_b$ with the largest gain ratio o(D, b, $s_b$) as the first branch node of the decision tree.

Figure 3:
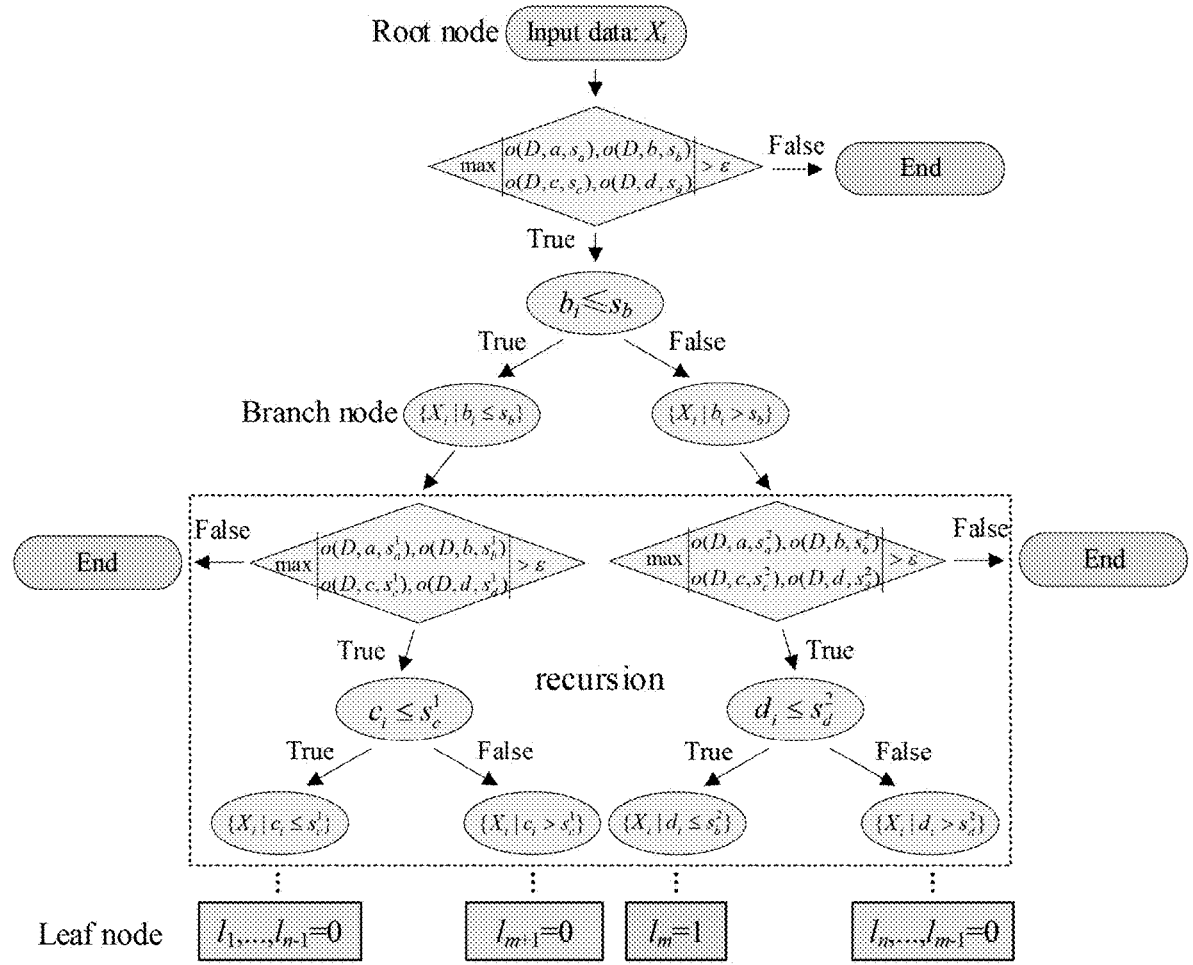
FIG. 3 shows an example flow chart of a decision tree.

FIG. 3 shows an example flow chart of a decision tree. Set the decision tree depth p and the threshold of the information gain ratio ε, which determines the identification accuracy. The depth p represents times of the recursive calculation. There are three situations where the decision tree is end. One is that if the maximum time of calculations reaches p, the division is stopped; another is that all the information gain ratios of each feature are less than ε, it is not divided either; the third is that if all labels of one leaf nodes are the same, there is no more division. First, all the data $X_i$ are input. The gain ratios of features (a, b, c, d) are calculated separately. Then, select the largest gain ration to compare with E. If the gain ratio is greater than ε, the corresponding feature is used as the feature of the first division. Suppose b is the selected feature. The split point $s_b$ is called the branch node. The data $X_i$ whose feature $b_i \leq s_b$ is in one collection. The data $X_i$ whose feature $b_i > s_b$ is in another collection. If the gain ratio is less than ε, the label of all the data is the same and the tree is a single node tree. Repeat the above steps recursively until the labels of the data in one collection are the same. The last layer node is called the leaf node.

A decision function is used to indicate whether the test data D' contains the step point. The test data is put into the decision tree which is suitably trained to judge its corresponding label $l_i$. The decision function is described as follows:

$$f(X_i') = \begin{cases} 0 \\ 1 \end{cases} i = 1, 2, 3, \ldots \quad (7)$$

where $X_i'$ represents the data in D'. Equation (7) indicates that if there is any step point in D', the corresponding label should be 1 through the decision tree. The remaining non-step data labels are 0. It is like the step data $X_m$ in FIG. 3.

Following this, the data before and after the step point are respectively tested for bad data, so as to achieve the purpose of correctly distinguishing between bad data and event data.

C. Algorithm Parameter Setting

Figure 4:
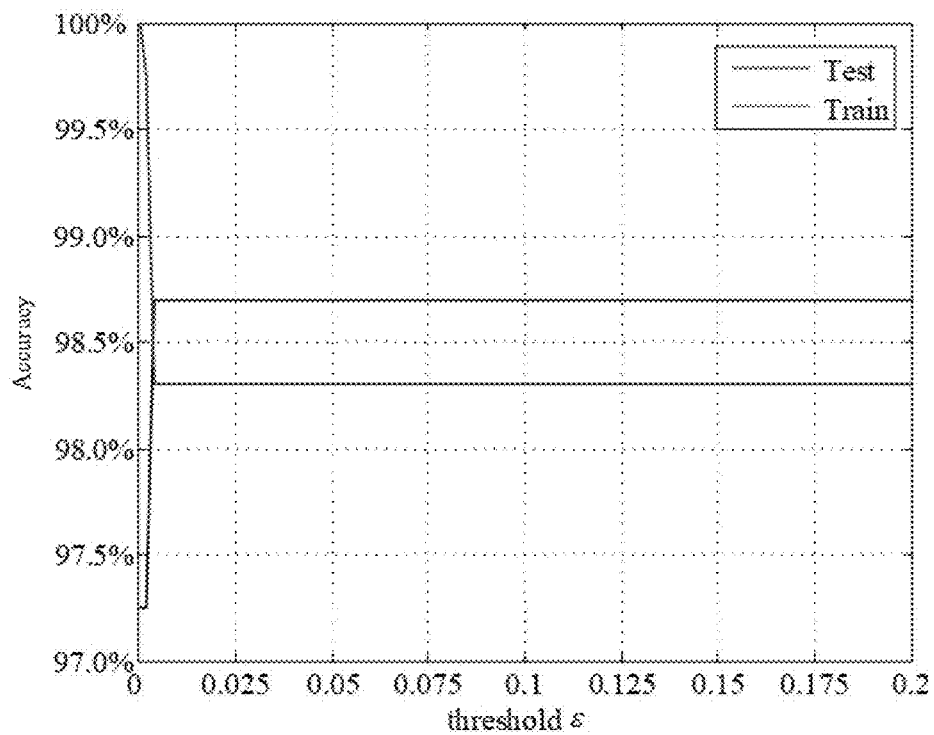
FIG. 4 shows example results of optimal parameters.
Figure 4:
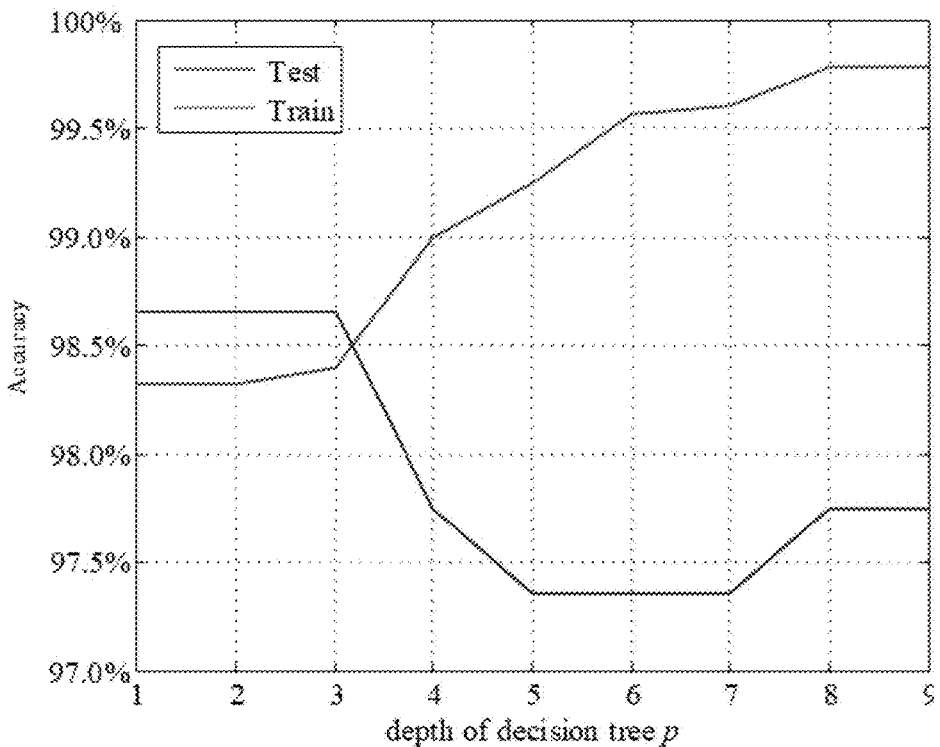

In order to get better results, a threshold ε of the information gain ratio and the depth of the decision tree p should be set at the beginning. The optimal parameters as followed are obtained by traversing. FIG. 4 shows example results of optimal parameters.

Specifically, FIG. 4*a* shows that when ε gradually increases to 0.0038, the accuracy of identification result obtained from the test data is up to 0.987 and then remains constant. Therefore, the threshold ε should be set to 0.0038. FIG. 4*b* demonstrates that if the depth is greater than 3, the accuracy of the test data will decrease. Because the greater the depth of the decision tree, the more complex the decision tree will be, which results in overfitting and reducing the test data accuracy. So, the depth of the decision tree p should be set 3.

III. Bad Data Detection Method

Event data can be successfully distinguished using the process detailed above. As PMU field data obeys a Gaussian distribution, the amplitudes of the data before the step occurs (seen as gray circles in FIG. 2*a*), and the amplitudes of the data after the step occurs (seen as yellow circles in FIG. 2*a*), are filtered separately by the 3σ rule.

$$P(\|X_i\|-\mu|\leq 3\sigma)\leq 99.73\% \qquad (8)$$

where μ represents the mean value of the amplitudes, and σ is the standard deviation of the amplitudes. If there is bad data, the bad data might be outside the range (μ−3σ, μ+3σ).

Figure 5:
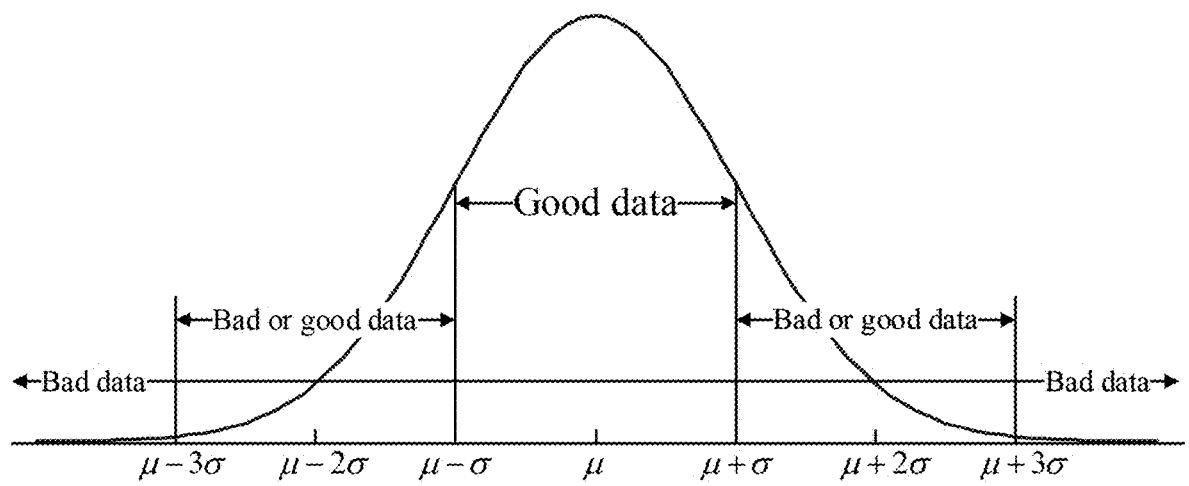
FIG. 5 shows an example bad data distribution diagram.

FIG. 5 shows an example bad data distribution diagram. In FIG. 5, the data distributed between (μ−σ, μ+σ) is considered as normal data. The data out of μ−3σ and μ+3σ is confirmed as bad data. But for the data between (μ−3σ, μ−σ) and (μ+σ, μ+3σ), they can be good data or bad data. They cannot be detected by the 3σ rule. Because when the amplitude of the bad data is close to the mean value of the data set, this rule cannot identify them. So, a detection method based on spectral clustering is still needed.

A. Theory of Spectral Clustering

After the initial filtering of bad data by the 3σ rule, a spectral clustering method is developed to detect bad data. Unlike the density-based clustering (DBSCAN) method, a spectral clustering method is uniquely graph-based and transforms the clustering problem into a graph segmentation problem. For the purpose of minimizing the cost of segmentation, the undirected weighted graph composed of a single sample is divided into multiple subgraphs in order to implement the clustering of bad and normal data.

Figure 6:
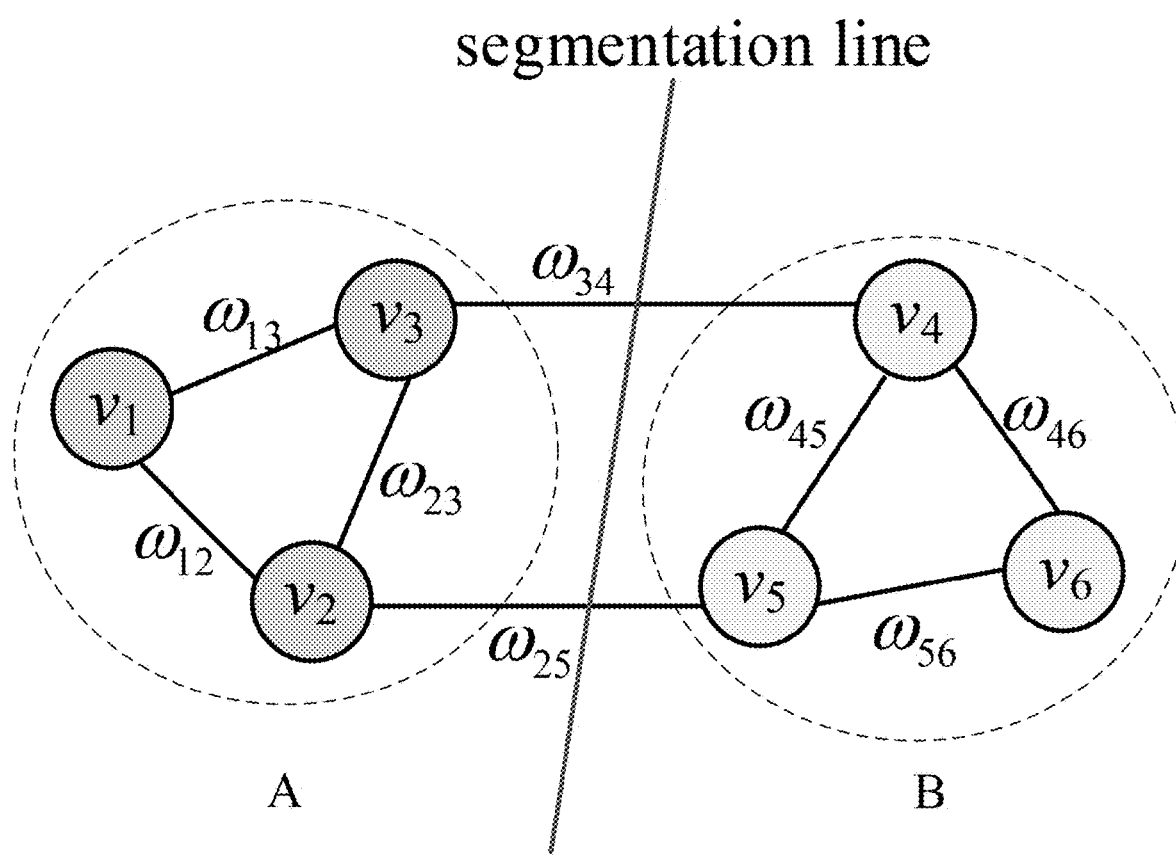
FIG. 6 shows an example segmentation of graphs in spectral clustering.

FIG. 6 shows an example segmentation of graphs in spectral clustering. FIG. 6 shows a graph G in which the vertices $v_i$, represent each data $X_i$ in the sample. The blue vertices represent the normal data, the yellow vertices represent the bad data, and the edge represents the relationship between the two vertices of it. The relationship is the weight $\omega_{ij}$ which indicates the degree of similarity between $v_i$ and $v_j$. As it is an undirected graph, $\omega_{ij}=\omega_{ji}$. The subgraph composed of normal data is called A, and the subgraph composed of bad data is B.

The purpose of spectral clustering is to cut the graph G to obtain two clusters: one with normal data, and the other with bad data. This requires the greatest similarity within the subgraph and the smallest similarity between subgraphs, much like the segmentation result of the blue line in FIG. 6. The total normal data is in one subgraph A, and the total bad data is in another subgraph B. For two subgraphs A and B in FIG. 6, the weights of the cut between A and B are defined as:

$$\mathrm{Cut}(A, B) = \sum_{i\in A, j\in B} \omega_{ij} \qquad (9)$$

Meanwhile, to maximize the number of vertices contained in each subgraph, the expression in (8) is improved as follows:

$$R\mathrm{Cut}(A, B) = \frac{1}{2}\left(\frac{\mathrm{Cut}(A, B)}{|A|} + \frac{\mathrm{Cut}(A, B)}{|B|}\right) \qquad (10)$$

where |A| represents the number of vertices in subgraph A, and |B| represents the number of vertices in subgraph B. Extending the equation to m subgraphs, the objective function becomes:

$$R\mathrm{Cut}(A_1, A_2, \ldots, A_m) = \frac{1}{2}\sum_{i=1}^{m}\frac{\mathrm{Cut}(A_i, \overline{A_i})}{|A_i|} \qquad (11)$$

Therefore, the objective function of spectral clustering is to solve the minimum value of (10), which is an NP-hard problem. It is transformed into the spectral decomposition problem of the similarity matrix. The suitable eigenvectors obtained by spectral decomposition are used to describe the low-dimensional structure of the data. The results are then obtained by using classical methods such as K-means.

First, the data in the sample is pre-processed, and the deviation $r_i$ between the amplitude and the mean value is taken as the clustering feature of each data $X_i$ by (12).

$$r_i = \left||X_i| - \frac{1}{N}\sum_{i=1}^{n}|X_i|\right| \qquad (12)$$

The similarity matrix W is established according to the similarity between any two data, and the similarity of any two data is defined as follows:

$$\omega_{ij} = \begin{cases} \exp\left(-\frac{\|r_i - r_j\|^2}{\delta^2}\right), & i \neq j \\ 0, & i = j \end{cases} \qquad (13)$$

where δ is the scale parameter, which is set by the "local scaling" idea.

The degree matrix $D_d$ is a diagonal matrix which is shown in (14).

$$D_d = \begin{bmatrix} d_1 & & & & \\ & d_{12} & & & \\ & & \ddots & & \\ & & & d_{n-1} & \\ & & & & d_n \end{bmatrix}, d_1 = \sum_{j=1}^{n} \omega_{ij} \quad (14)$$

Let L be the Laplacian matrix:

$$L = D_d - W \quad (15)$$

Thus, L is a symmetric positive semidefinite matrix and its eigenvalues are $\lambda_i$. The eigenvalues arranged as follows:

$$0 = \lambda_1 \leq \lambda_2 \leq \ldots \leq \lambda_n \quad (16)$$

For any vector f, there is, $$f^T L f = \frac{1}{2} \sum_{i,j=1}^{n} \omega_{ij}(f_i - f_j)^2 \quad (17)$$

The indication vector is defined as $h_j$, $$h_j = (h_{1j}, \ldots, h_{nj})^T \quad (18)$$

$$h_{ij} = \begin{cases} \frac{1}{\sqrt{|A_j|}}, & v_i \in A_j \\ 0, & v_i \notin A_j \end{cases}, i = 1, 2, \ldots, n \; j = 1, 2, \ldots, m \quad (19)$$

Let $H \in \mathbb{R}^{n \times m}$ be a matrix containing m indicator vectors as column vectors. The column vectors of H are orthogonal to each other, $H^T H = I$. Next, there is, $$h_i^T L h_i = \quad (20)$$

$$\frac{1}{2}\sum_{u=1}^{}\sum_{n=1}^{}\omega_{un}(h_{iu}-h_{in})^2 = \frac{1}{2}\left(\sum_{u \in A_i, n \notin A_i}\omega_{un}\left(\frac{1}{\sqrt{A_i}}-0\right)^2 + \sum_{u \in A_i, n \notin A_i}\omega_{un}\left(0-\frac{1}{\sqrt{A_i}}\right)^2\right) =$$

$$\frac{1}{2}\left(Cut(A_i, \overline{A_i})\frac{1}{|A_i|} + Cut(\overline{A_i}, A_i)\frac{1}{|\overline{A_i}|}\right) = \frac{Cut(A_i, \overline{A_i})}{|A_i|}$$

Equation (20) shows that for a subgraph $A_i$, its cut corresponds to $h_i^T L h_i$. For m subgraph, use $$RCut(A_1, A_2, \ldots, A_m) = \sum_{i=1}^{m} h_i^T L h_i = \sum_{i=1}^{m} (H^T L H)_{ii} = Tr(H^T L H) \quad (21)$$

The objective function is converted to $$\begin{cases} \min_{H \in \square^{n \times k}} Tr(H^T L H) \\ \text{s.t. } H^T H = I \end{cases} \quad (22)$$

Figure 7:
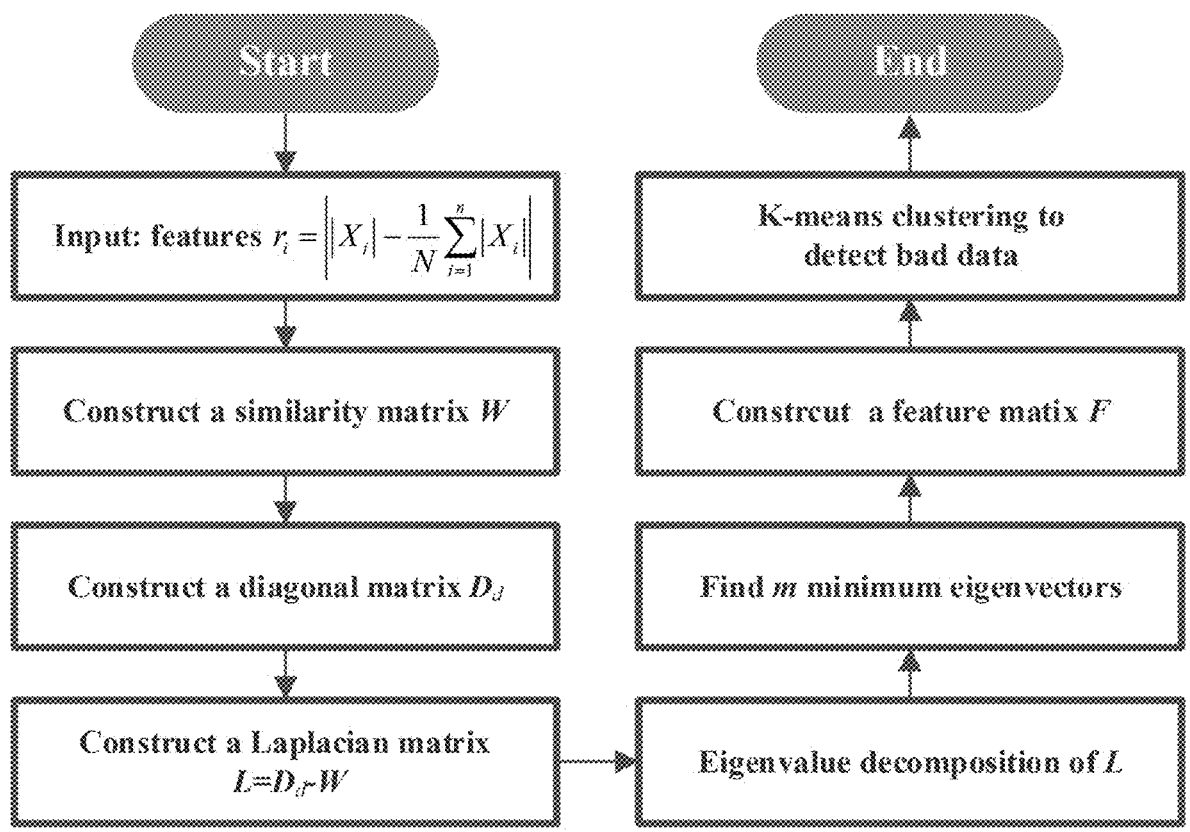
FIG. 7 shows an example flowchart and pseudocode of the detection method.

According to the Rayleigh quotient property, the minimum value of (22) is equal to the sum of the m smallest eigenvalues of L. Finally, K-means clustering is performed on the matrix F composed of the eigenvectors corresponding to the minimum m eigenvalues of L. Thereby, clustering of normal data and bad data is realized, as shown in FIG. 6, and the normal data and bad data are completely separated. FIG. 7 shows an example flowchart and pseudocode of the detection method.

TABLE II

ALGORITHM OF SPECTRAL CLUSTERING

Input: $X_i$: all the PMU data, n: number of PMU data, $r_i$: clustering features;
Output: $C_1$: the cluster of good data, $C_2$: the cluster of bad data;
1: Calculate clustering features $r_i$ by (12);
2: Construct a similarity matrix W according to (13);
3: Construct a diagonal matrix $D_d$ according to (14);
4: Construct the Laplacian matrix L, $L = D_d$-W;
5: Decompose the eigenvalues of the matrix L to find the smallest in eigenvectors;
6: Construct the matrix F composed of in eigenvectors;
7: Use K-means to cluster F, get $C_1$ and $C_2$;
8: All the bad data in $C_1$ can be detected.

According to the above process, the clustering features are first calculated as input by using the amplitude data, and then the similarity, diagonal and Laplacian matrices are constructed. Then decompose the eigenvalues of the matrix L to find the smallest m eigenvectors. The matrix F is composed of m eigenvectors. Clusters $C_1$ and $C_2$ can be obtained by K-means. $C_1$ contains normal data, and $C_2$ contains bad data, that is, the bad data detection is realized.

B. Bad Data Detection Algorithm Flow

Figure 8:
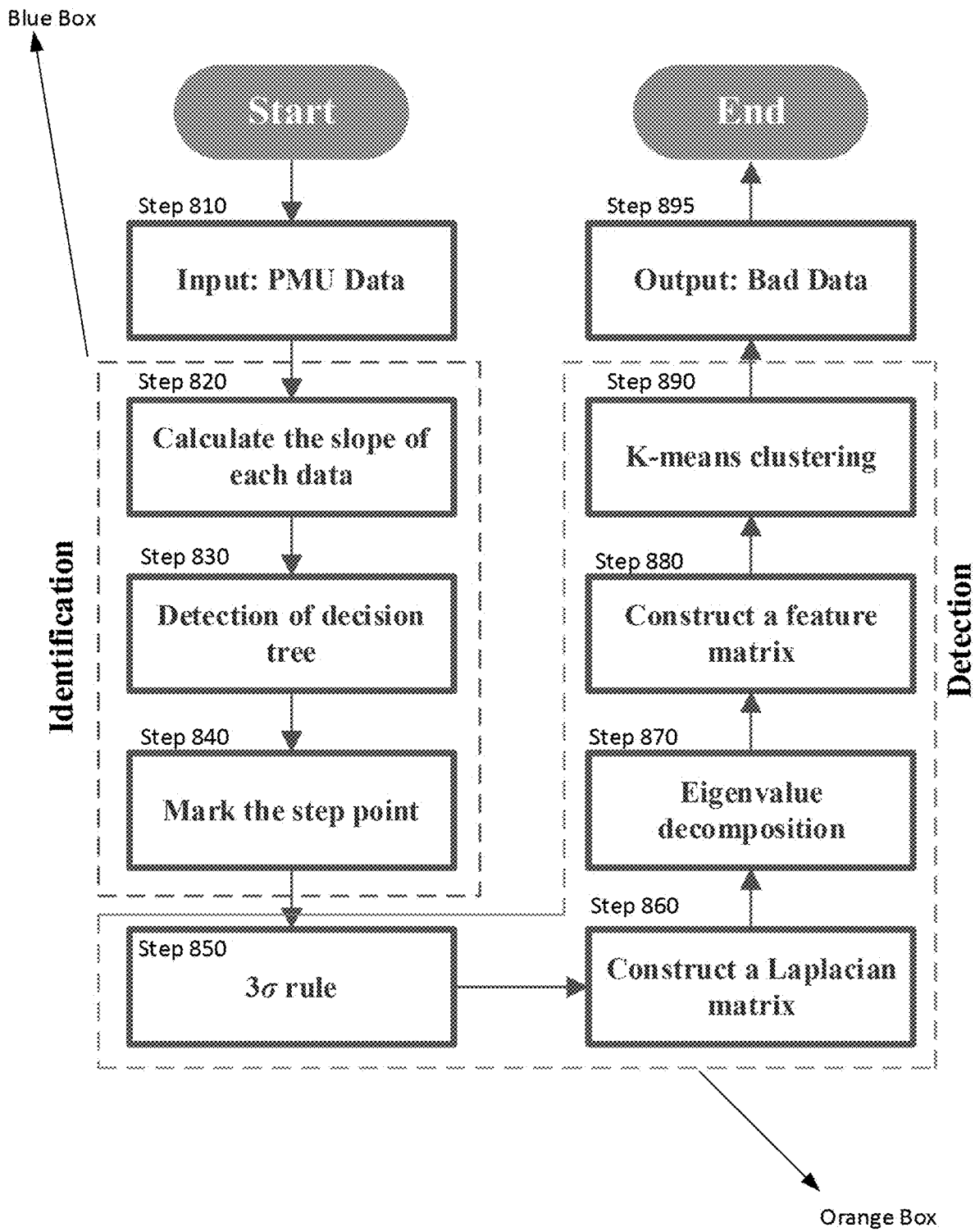
FIG. 8 shows an example flowchart for a bad data detection algorithm.

FIG. 8 shows an example flowchart for a bad data detection algorithm. The algorithm has two parts. The first part in the blue box is the event data and bad data identification method based on the decision tree. The details of the decision tree can be viewed in FIG. 3. The second part in the orange box is the bad data detection method based on spectral clustering. The process of spectral clustering can be seen in FIG. 7.

In a step 810, input data from a PMU is received at a phasor data concentrator (PDC). A PDC receives and time-synchronizes phasor data from multiple phasor measurement units (PMUs) to produce a real-time, time-aligned output data stream. A PDC can exchange phasor data with PDCs at other locations. Through use of multiple PDCs, multiple layers of concentration can be implemented within an individual synchrophasor data system.

In a step 820, the slope for each data point is calculated. Specifically, the slope of each data point $k_i$ is calculated as follows:

$$k_i = \left| \frac{|X_{i+1}| - |X_i|}{t_{i+1} - t_i} \right| \quad (1)$$

In a step 830, a C4.5 decision tree is utilized as a binary classification model to generate an output. The decision tree can include the following steps. First, a depth p and a threshold of the information gain ratio ε can be set, wherein the depth p represents the number of times for the recursive calculation to be performed and the threshold of the information gain ratio ε determines an identification accuracy.

Second, a gain ratios of features (a, b, c, d) are calculated separately for each data point, wherein the gain ratio of the feature b is calculated as follows:

$$o(D, b, s_i) = \frac{O(D, b, s_i)}{I(b)} \quad (5)$$

$$I(b) = -\sum_{\beta \in \{-,+\}} \frac{|D_{s_i}^\beta|}{|D|} \log_2 \frac{|D_{s_i}^\beta|}{|D|} \quad (6)$$

where I(b) is the intrinsic value.

Then, select the largest gain ration to compare with E. If the gain ratio is greater than ε, the corresponding feature is used as the feature of the first division. Suppose b is the selected feature. The split point $s_b$ is called the branch node. The data $X_i$ whose feature $b_i \leq s_b$, is in one collection. The data $X_i$ whose feature $b_i > s_b$, is in another collection. If the gain ratio is less than ε, the label of all the data is the same and the tree is a single node tree. Repeat the above steps recursively until the labels of the data in one collection are the same.

In a step 840, a decision function is used to determine whether a test data D' contains a step point. The test data is put into the decision tree which is suitably trained to judge its corresponding label $l_i$. The decision function is described as follows:

$$f(X_i') = \begin{cases} 0 \\ 1 \end{cases} \quad i = 1, 2, 3, \ldots \quad (7)$$

where $X_i'$ represents the data in D'. If there is any step point in D', the corresponding label should be 1 through the decision tree. The remaining non-step data labels are 0.

In a step 850, an amplitudes of the data before the step occurs and an amplitudes of the data after the step occurs are filtered separately by the 3σ rule, as follows:

$$P(|X_i|-\mu| \leq 3\sigma) \leq 99.73\% \quad (8)$$

where μ represents the mean value of the amplitudes, and σ is the standard deviation of the amplitudes. If there is bad data, the bad data might be outside the range (μ−3σ, μ+3σ).

In a stop 860, construct a Laplacian matrix L:

$$L = D_d - W \quad (15)$$

wherein a similarity matrix W is established according to the similarity between any two data, and the similarity of any two data is defined as follows:

$$\omega_{ij} = \begin{cases} \exp\left(-\frac{\|r_i - r_j\|^2}{\delta^2}\right), & i \neq j \\ 0, & i = j \end{cases} \quad (13)$$

where δ is the scale parameter, which is set by the "local scaling" idea.

The degree matrix $D_d$ is a diagonal matrix which is shown in (14).

$$D_d = \begin{bmatrix} d_1 & & & & \\ & d_2 & & & \\ & & \ddots & & \\ & & & d_{n-1} & \\ & & & & d_n \end{bmatrix}, d_i = \sum_{j=1}^{n} \omega_{ij} \quad (14)$$

In a step 870, decompose the eigenvalues of the matrix L to find the smallest m eigenvectors, wherein the minimum value of the following is equal to the sum of the m smallest eigenvalues of matrix L:

$$\begin{cases} \min_{H \in \square^{n \times k}} Tr(H^T L H) \\ \text{s.t.} \quad H^T H = I \end{cases} \quad (22)$$

In a step 880, construct the matrix F composed of the eigenvectors corresponding to the minimum m eigenvalues of matrix L.

In a step 890, use K-means to cluster matrix F and obtain $C_1$ and $C_2$. $C_1$ contains normal data, and $C_2$ contains bad data.

In a step 895, provide $C_1$ containing normal data, and $C_2$ containing bad data. The normal data and bad data are marked in the PDC. Then, the data is sent to a main power station. In the main power station, the bad data can be corrected by a corresponding recovery method. Furthermore, the PMU data which has the good quality can be used to monitor the operating status of the power system and perform closed-loop control on it.

IV. Case Studies

The algorithms presented in this disclosure were tested by simulation. In addition, field recorded PMU data was used to verify the method. The results are then compared with the ensemble method and the DBSCAN method.

A. Simulation

1) Simulation of Data Identification Method

When the power system is in normal operation, the data is ambient and has no external interference. The general expression of its signal is as follows:

$$x(t) = \sqrt{2} X_m \cos(2\pi f_0 t + \varphi_0) + n(t) \quad (23)$$

where $X_m$ is the phasor amplitude, $f_0$ represents power frequency, $\varphi_0$ is the initial phases, $X_m$=57.73 V, $f_0$=50 Hz, φ0=0, and the signal-noise ratio of n(t) is 60 dB.

Different values of amplitude step (1 V, 1.5 V, 2 V, 3 V) were set different durations (0.1 s, 0.5 s, 1 s, 2 s) to test the validity of the described method. The experiments are repeated 20 times. Also, many experiments with multiple parameters for the support vector machine (SVM) and the back-propagation algorithm (BP) have been conducted and the best accuracy is used for comparison. The kernel function of SVM is radial basis function kernel, gamma is 0.25, and the penalty factor is 10. The BP neural network is a 3-layer network. The input layer has 4 nodes, the hidden layer has 12 nodes, and the output layer has 2 nodes. The number of iterations is 100. It was found that the ensemble method and DBSCAN method cannot identify the step point and the average results.

Figure 9:
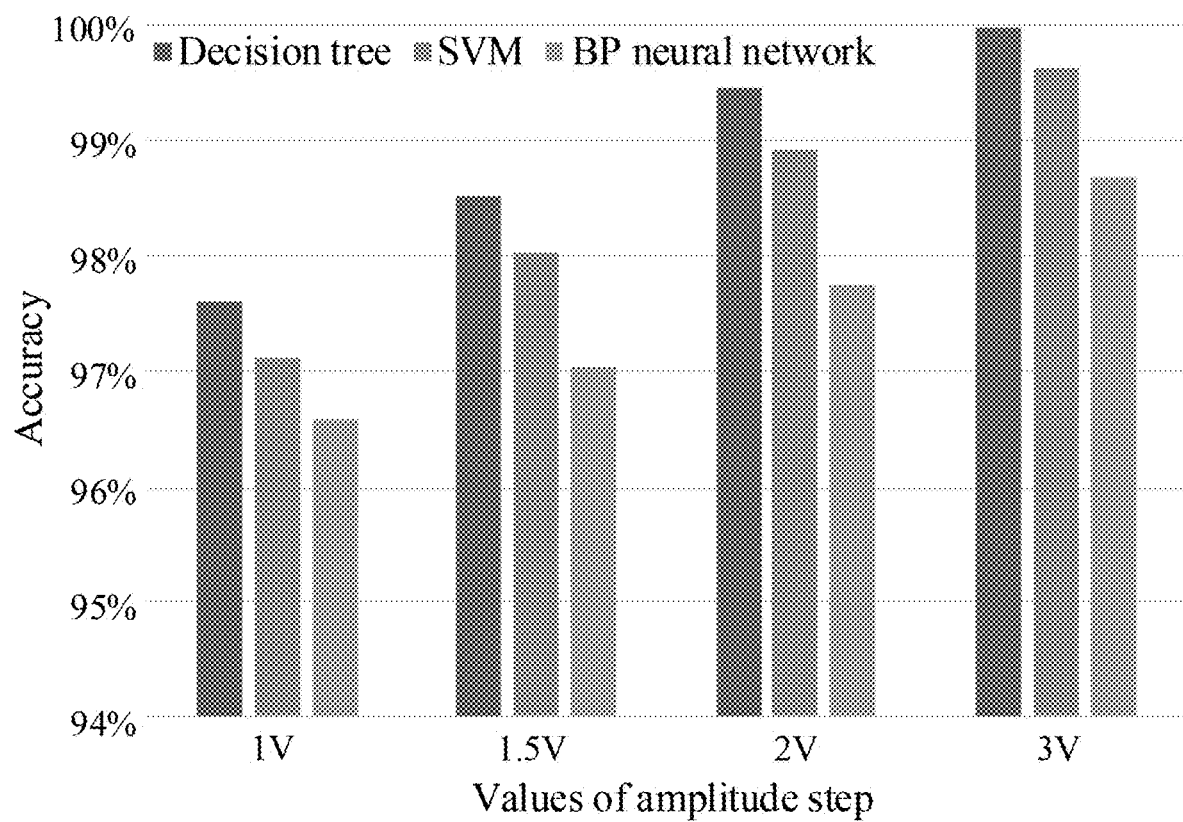
FIG. 9 shows an example identification result of different methods of ambient data.

FIG. 9 shows an example identification result of different methods of ambient data. In FIG. 9, the horizontal axis represents the values of the amplitude step, and the vertical axis represents the average identification accuracy under different durations. As illustrated in the bar chart, the proposed method is more accurate than SVM and BP neural networks in different tests. When the amplitude increases, the identification accuracy increases, because the greater the step value is, the more obvious the features are.

Signal with amplitude and phase angle modulation is used to express the oscillation with low oscillation frequency. The signal expression is as follows:

$$x(t) = \sqrt{2}\,(X_m + X_d\cos(2\pi f_d t + \varphi_a)) \qquad (24)$$
$$\cos(2\pi f_0 t + X_k\cos(2\pi f_a t + \varphi_a) + \varphi_0) + n(t)$$

where $X_d$ is amplitude modulation depth, $X_k$ is phase angle modulation depth, $f_d$ is modulation frequency, $\varphi_a$ is the initial phase angle of modulation part, $X_d$=0.5%, $f_a$=5 Hz, and $X_k$=5.7°.

Figure 10:
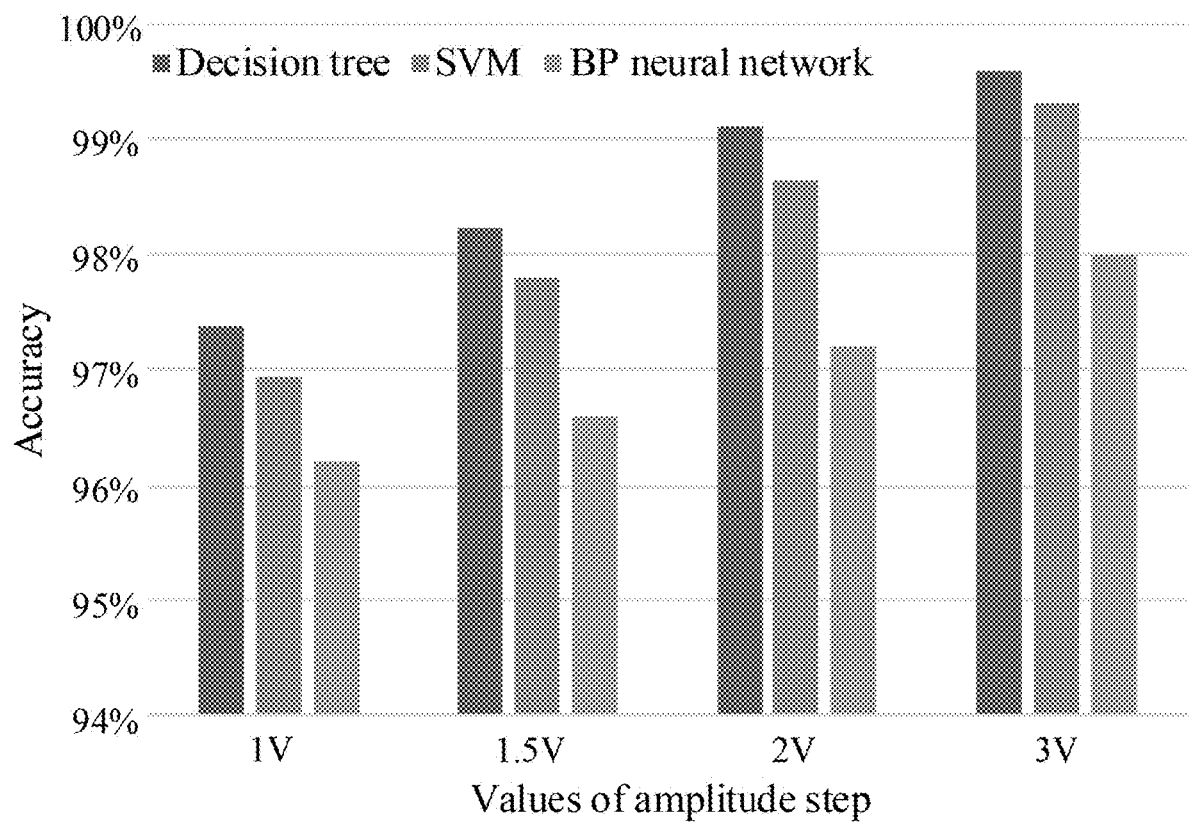
FIG. 10 shows example identification result of different methods of disturbance data.

The accuracy of the identification of the event data and the oscillation data was then tested using the above steps. FIG. 10 shows example identification result of different methods of disturbance data. FIG. 10 shows that during the oscillation, event data can also be identified by the proposed method. The average accuracy of the proposed method is 98.5%, higher than the other two methods. The results of SVM are better than the results of the BP neural network. Because in this disclosure, the sample data is small, BP neural network has no advantages. The accuracy of SVM is related to kernel function and other parameters. So, the described method is more suitable.

2) Simulation of Data Detection Method

Figure 11:
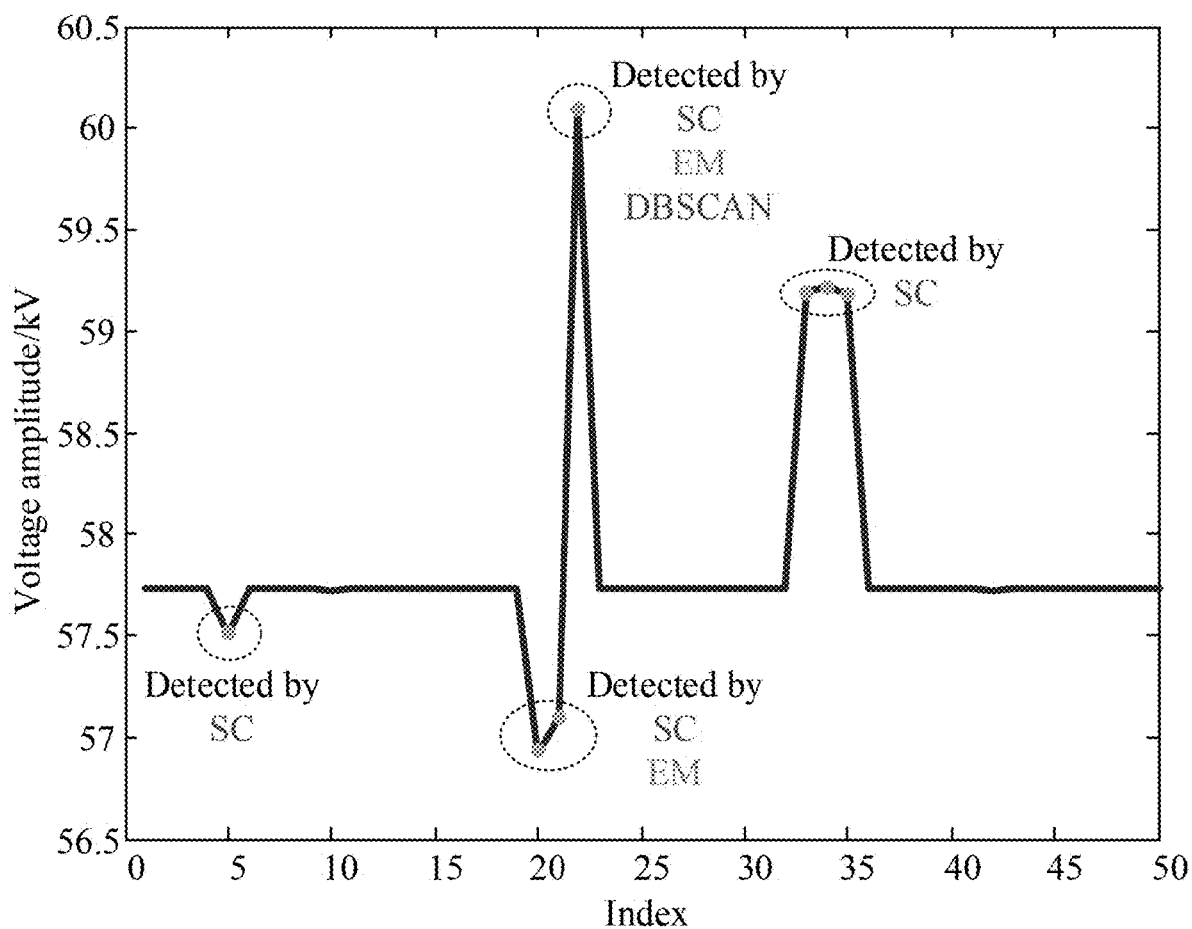
FIG. 11 shows example results of three detection methods of ambient data.

For the signal in (23), a number of single or contiguous bad data were artificially set, and the deviation range was from 0.3% to 5%. FIG. 11 shows example results of three detection methods of ambient data. FIG. 11 shows the ambient data with some bad data, which is marked by gray. In this figure, SC refers to the method described in this disclosure, EM is the ensemble method detailed, and DBSCAN is another method. It can be observed that the ensemble method and DBSCAN method can effectively identify when the amplitude of bad data changes greatly. However, the DBSCAN method cannot identify bad data with an amplitude that is close to normal value. Because when the deviation of bad data is small, it is closely related to the normal data. The bad data can easily be considered as the normal based on the strong density relationship. The ensemble method also struggles to identify contiguous bad data as it is based on the prerequisite that amplitudes of continuous bad data contrast dramatically. The described method can detect both single and contiguous bad data.

Figure 12:
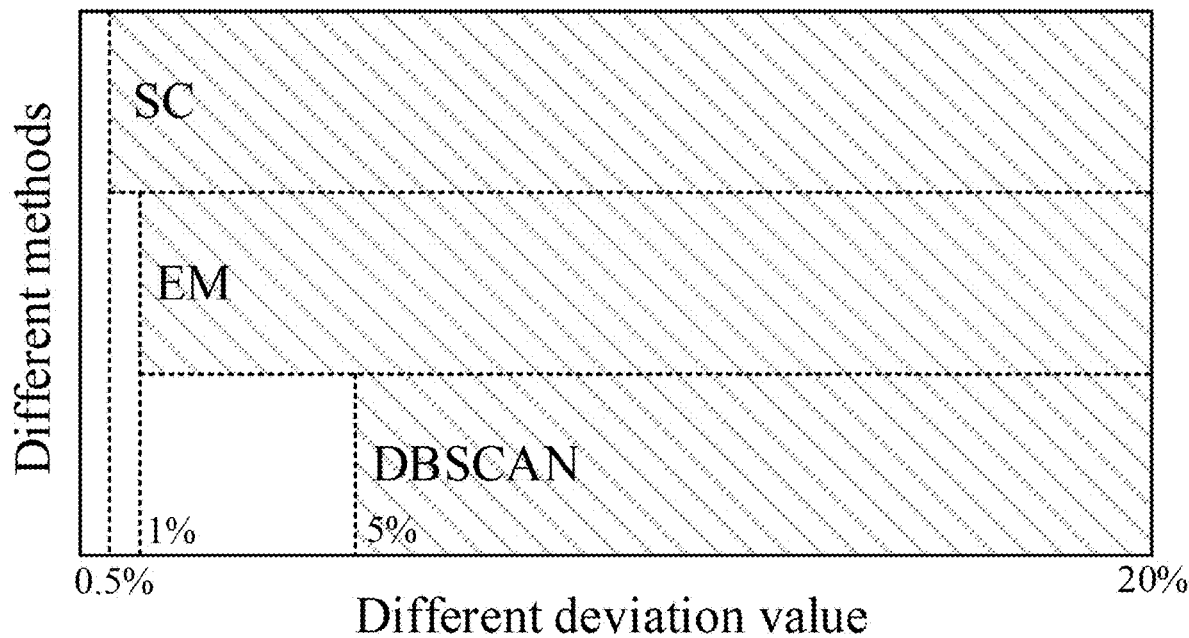
FIG. 12 shows exemplary comparison of the three methods under different deviation values.

Using the signal in (23), the detection range of the three methods by changing the deviation value of single bad data was compared. FIG. 12 shows exemplary comparison of the three methods under different deviation values. FIG. 12 illustrates that when the deviation value of bad data is lower than 1%, the ensemble method cannot detect it. When the deviation value of bad data is lower than 5%, the DBSACN method cannot detect it. The described method can detect bad data with a deviation value from 0.5% to 20%.

Moreover, the ratio and position of bad data in FIG. 11 were randomly changed. The comparison of the detection ability of the three methods is as follows.

TABLE III

COMPARISON OF THREE METHODS UNDER DIFFERENT RATIOS OF BAD DATA

| Method | 1.0% | 2.5% | 5.0% | 10% | 15% |
|---|---|---|---|---|---|
| SC | ✓ | ✓ | ✓ | ✓ | ✓ |
| EM | ✓ | ✓ | ✓ | x | x |
| DBSCAN | ✓ | ✓ | ✓ | x | x |

Table III shows that when the ratio of bad data is higher than 10%, the ensemble method and DBSCAN method cannot detect it completely, while the described method can detect the ratio from 1% to 15%.

Figure 13:
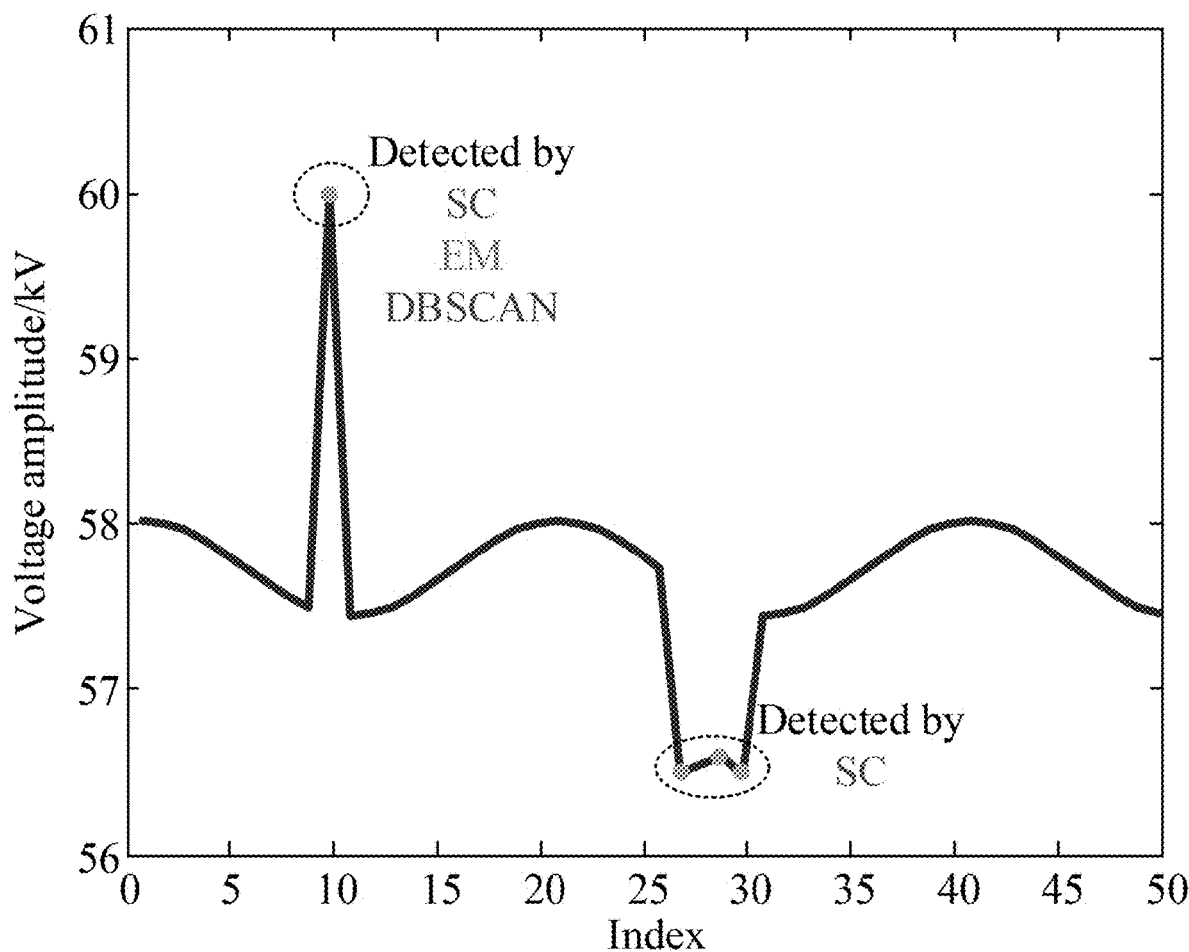
FIG. 13 shows example results of three detection methods of disturbance data.

The signal in (24) represents the disturbance occurring in the system in which some bad data is randomly set. FIG. 13 shows example results of three detection methods of disturbance data. FIG. 13 indicates that when there is some data during a disturbance, the data divergent from the normal value can be detected by the three methods. However, the data with an amplitude close to the normal value cannot be detected by the DBSCAN method. Due to the close value, the density relationship is strong and can easily be classified into one cluster. Ensemble method cannot detect contiguous bad data because if the data in the middle is not much different from before and after, it is considered as normal. The described method can detect both single and contiguous bad data.

B. Simulation

A PMU device suitable for a distribution network was been successfully developed in the laboratory. The PMU can measure the related parameters of the fundamental frequency, harmonics, and inter-harmonics in a distribution network in real-time. Due to the synchronization signal loss on Jun. 17, 2019, the phase angle measurement jumps, which causes the frequency and the rate of change of frequency jump. Since the amplitude is corrected according to frequency, so the amplitude also jumps. The bad data is used to verify the described method.

1) Field Data Verification of Data Identification Method

Figure 14:
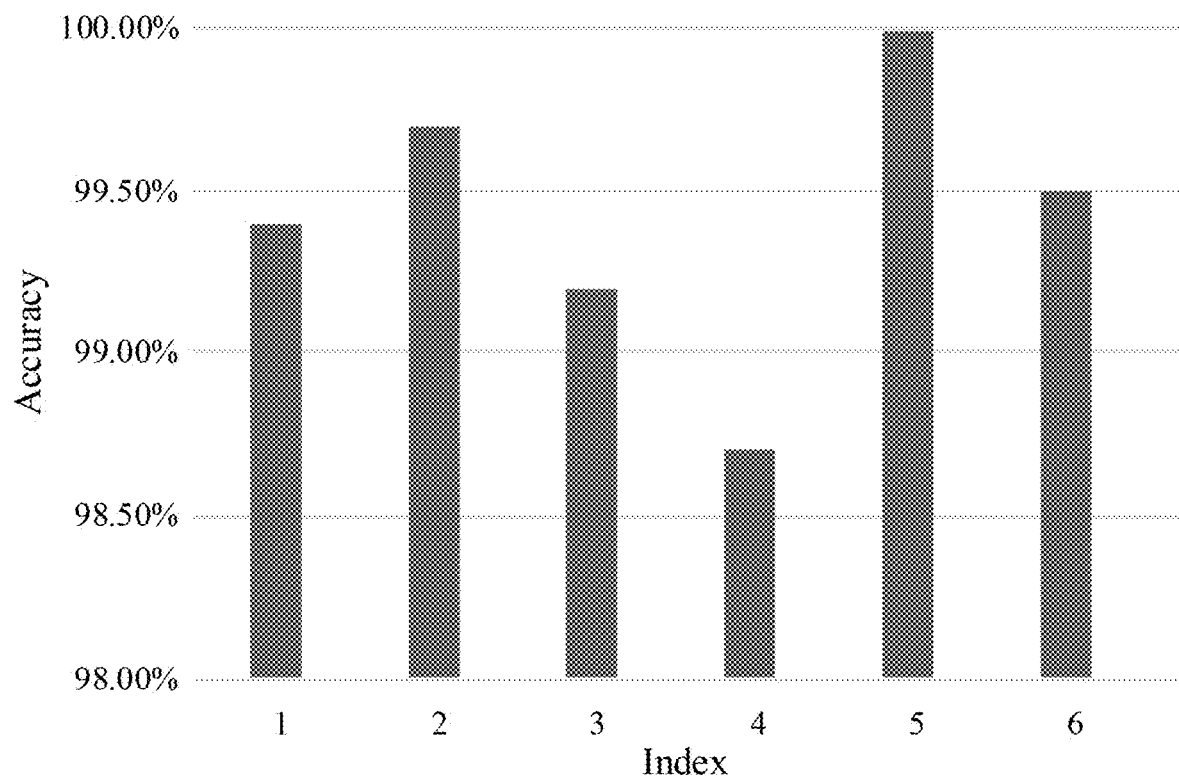
FIG. 14 shows exemplary identification results of event data.

Aiming to verify the rationality of the parameter selection, the measurement of six other independent PMUs was validated to test the identification method. FIG. 14 shows exemplary identification results of event data. As seen in FIG. 14, the selected parameters of the decision tree are appropriate to field data from other PMUs, and the accuracy of the event data identification method is higher than 98.6%.

2) Field Data Verification of Data Detection Method

Figure 15:
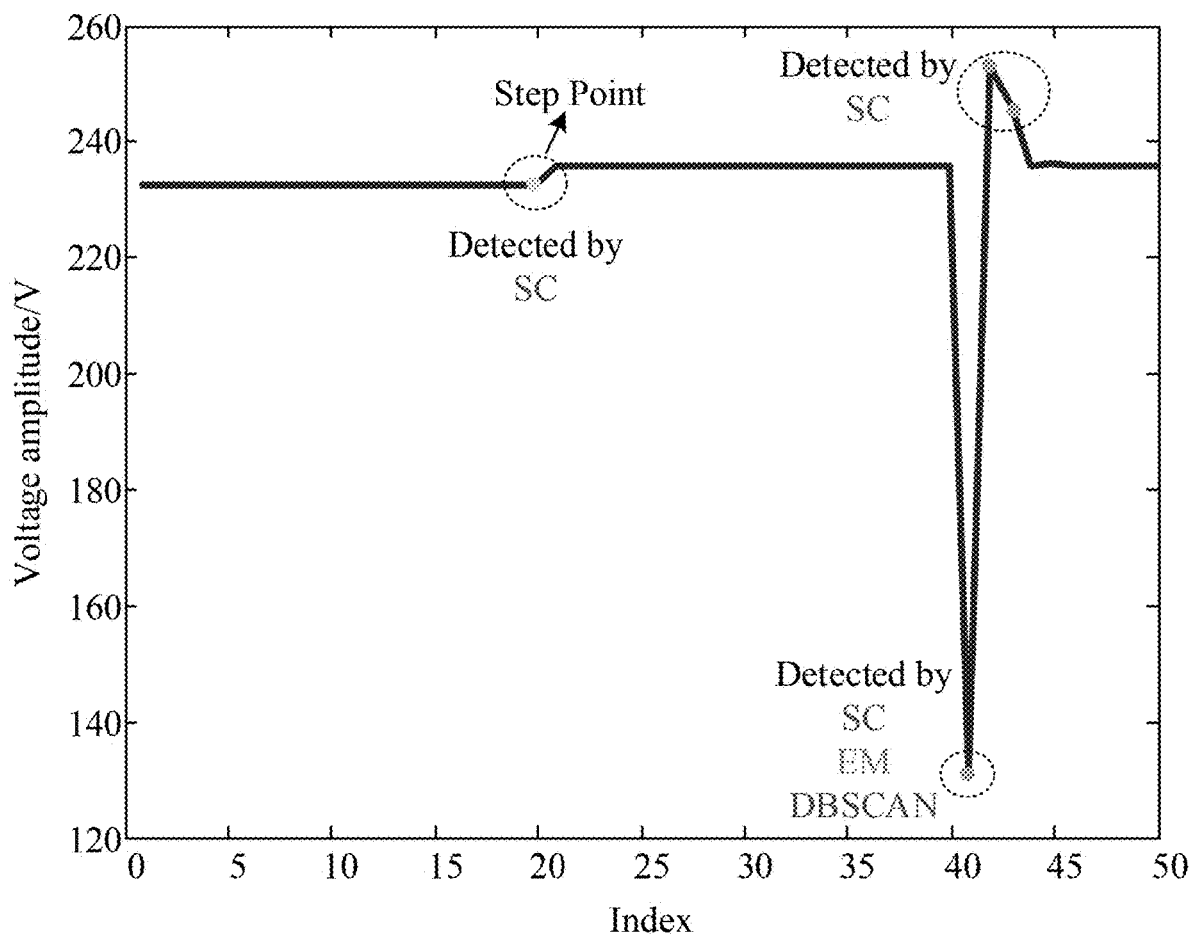
FIG. 15 shows exemplary results of three detection methods of field data in a distribution network.

Filed data in the distribution network with event data and bad data was used to verify the algorithm. FIG. 15 shows exemplary results of three detection methods of field data in a distribution network. FIG. 15 shows that the described method can identify the step point while the other two methods may decipher it as bad data. When the amplitude of bad data changes dramatically, all three methods can detect it. If the amplitude of bad data is close to the normal value, the DBSCAN method cannot detect it as the density relationship between bad data and normal data is strong. The ensemble method cannot detect bad data with an amplitude that is near normal as the deviation does not exceed the set threshold. The described method can detect contiguous bad data regardless if the deviation is large or small.

Figure 16:
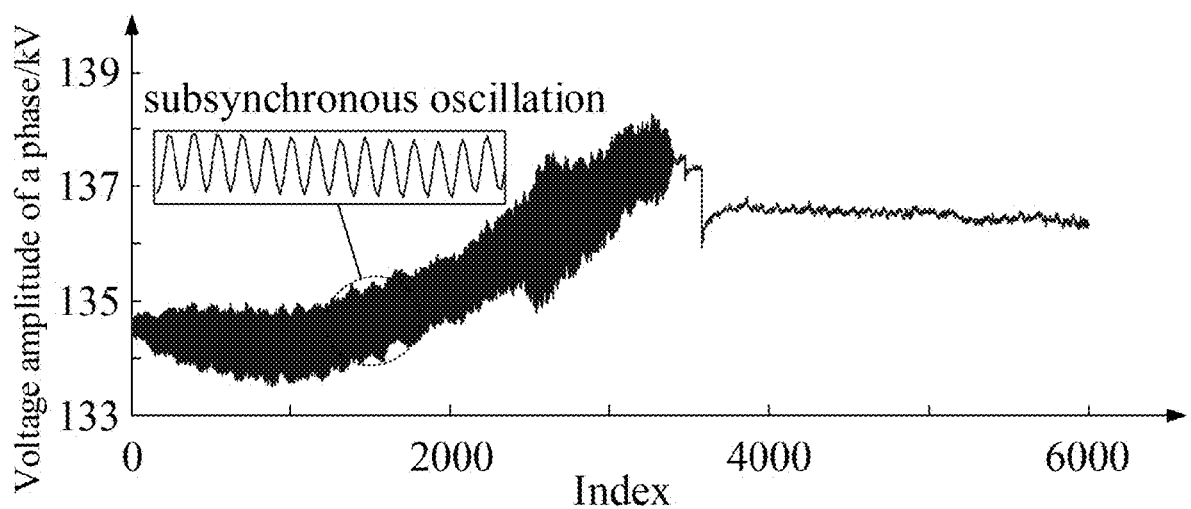
FIG. 16 shows exemplary PMU field data in a renewable energy area.
Figure 17:
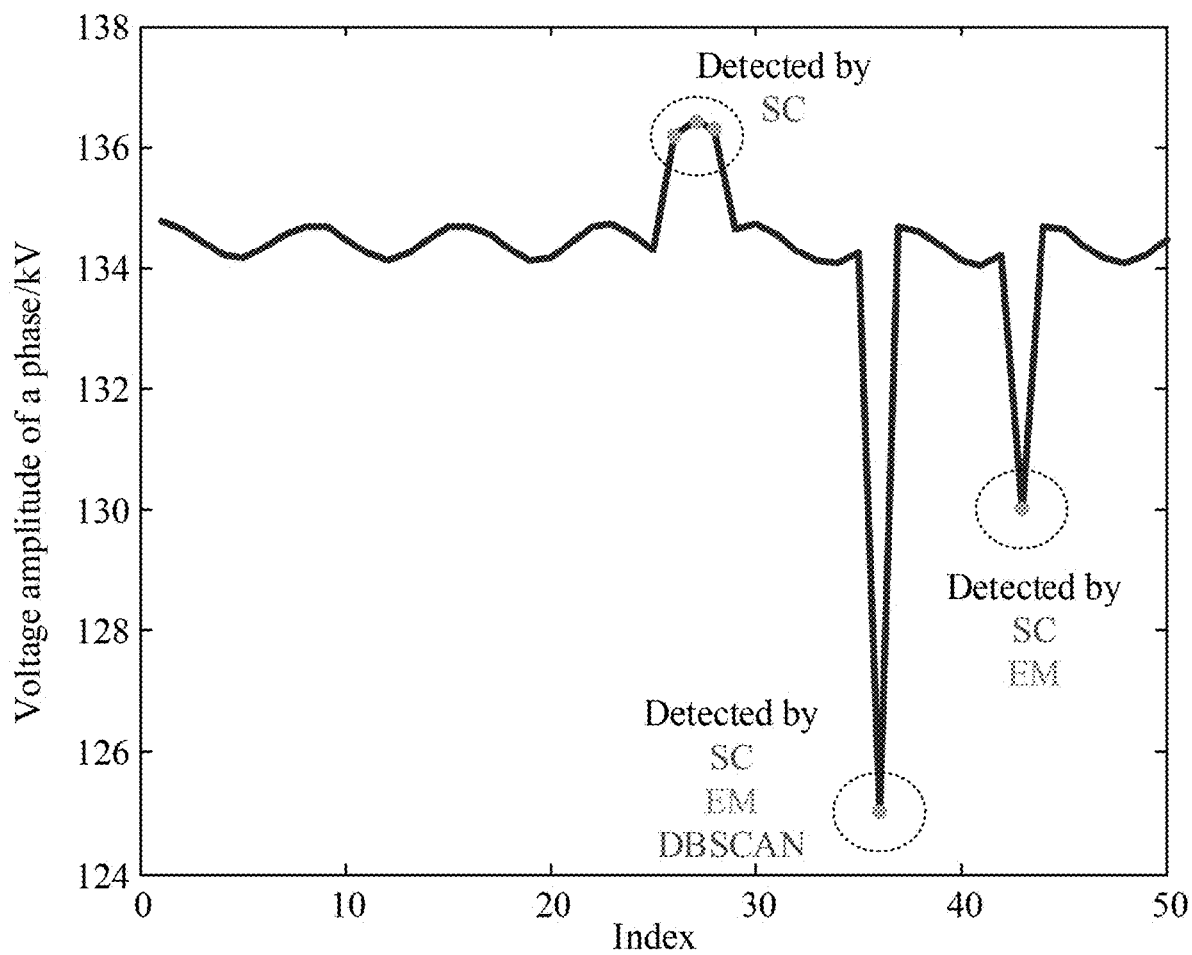
FIG. 17 shows exemplary results of three detection methods of field data in a renewable energy area.

In addition, the bad data was artificially set for field data from a certain subsynchronous oscillation in areas with renewable energy sources in western China. FIG. 16 shows exemplary PMU field data in a renewable energy area. FIG. 17 shows exemplary results of three detection methods of field data in a renewable energy area. It can be seen from FIG. 16 that there is a single PMU measurement and the reporting rate is 100 Hz. The subsynchronous oscillation lasts about 33 s. FIG. 17 shows that when there are contiguous bad data, the detection result of the proposed method is better than the other two methods. The detection range of the ensemble method is larger than that of the DBSCAN method. Therefore, the proposed method can be practically applied to detect all the bad data in FIG. 17.

3) Comparison of Performance of Different Methods

The running time of three detection methods is compared with different time windows. It should be pointed out that the running time of the described method in this disclosure does not include the bad data and event data identification process. When the time window contains 200 data points, the running time of the identification method is about 0.002 s. The calculation speed of the identification method is fast. The results of the running time of three detection methods are shown in Table IV, where EM represents the ensemble method, DB represents the DBSCAN method and SC represents the proposed method. It reports that the running time of the three methods increases as the time window expands. The ensemble method runs longer than the other two methods because this method is more complicated. The running time of the DBSCAN method is close to that of the proposed method. Because they are relatively simple and both belong to clustering methods.

TABLE IV

COMPARISON OF RUNNING TIME OF THREE METHODS

| Time window (of data points) | $Time_{EM}$/s | $Time_{DB}$/s | $Time_{SC}$/s |
| --- | --- | --- | --- |
| 0.5 s (25) | 0.0052 | 0.0025 | 0.0028 |
| 1 s (50) | 0.011 | 0.0049 | 0.0053 |
| 2 s (100) | 0.026 | 0.013 | 0.011 |
| 3 s (150) | 0.042 | 0.021 | 0.019 |
| 4 s (200) | 0.057 | 0.028 | 0.026 |
| 0.5 s (25) | 0.0052 | 0.0025 | 0.0028 |

When the ration of bad data is constant, changing the deviation range of bad data, the accuracy of the three methods was compared.

TABLE V

COMPARISON OF ACCURACY OF THREE METHODS

| Ratio/range | | Accuracy |
| --- | --- | --- |
| 1.0%/5.0% | SC | 99.61% |
| | EM | 98.48% |
| | DBSCAN | 93.15% |
| 1.0%/10% | SC | 99.85% |
| | EM | 99.13% |
| | DBSCAN | 94.21% |
| 2.5%/5.0% | SC | 98.53% |
| | EM | 96.32% |
| | DBSCAN | 90.54% |
| 2.5%/10% | SC | 98.65% |
| | EM | 97.69% |
| | DBSCAN | 91.10% |
| 5.0%/5.0% | SC | 96.48% |
| | EM | 93.52% |
| | DBSCAN | 86.36% |
| 5.0%/10% | SC | 97.57% |
| | EM | 95.78% |
| | DBSCAN | 88.05% |

Table V shows that the described method has higher accuracy than the other two methods under different scenarios. As the ratio of bad data increases, the detection accuracy of the three methods decreases. The accuracy increases as the deviation range of bad data increases. The DBSCAN method is more affected by the ratio and range.

V. Conclusion

This disclosure describes a data-driven PMU bad data detection algorithm. It is only relied on a single PMU and do not need the system topology or parameters. It can improve the quality of PMU data, and lay a foundation for better application of PMU data to power systems. The main conclusions are as follows:

1) A data identification method based on a decision tree is described. Compared with existing methods, it avoids mistaking event data for bad data by learning the slopes of each data.

2) A bad data detection method based on spectral clustering is developed. It can use the degree of association between data to cluster bad data. It accomplishes in detecting bad data with small deviation values which is not easy for existing methods to detect.

3) The simulation and field data tests prove that the described algorithm has effectiveness on bad data identification and detection. It can provide PMU data with high quality for the power systems.

Technical Implementation of an Aspect of Phasor Data Concentrator (PDC)

Figure 18:
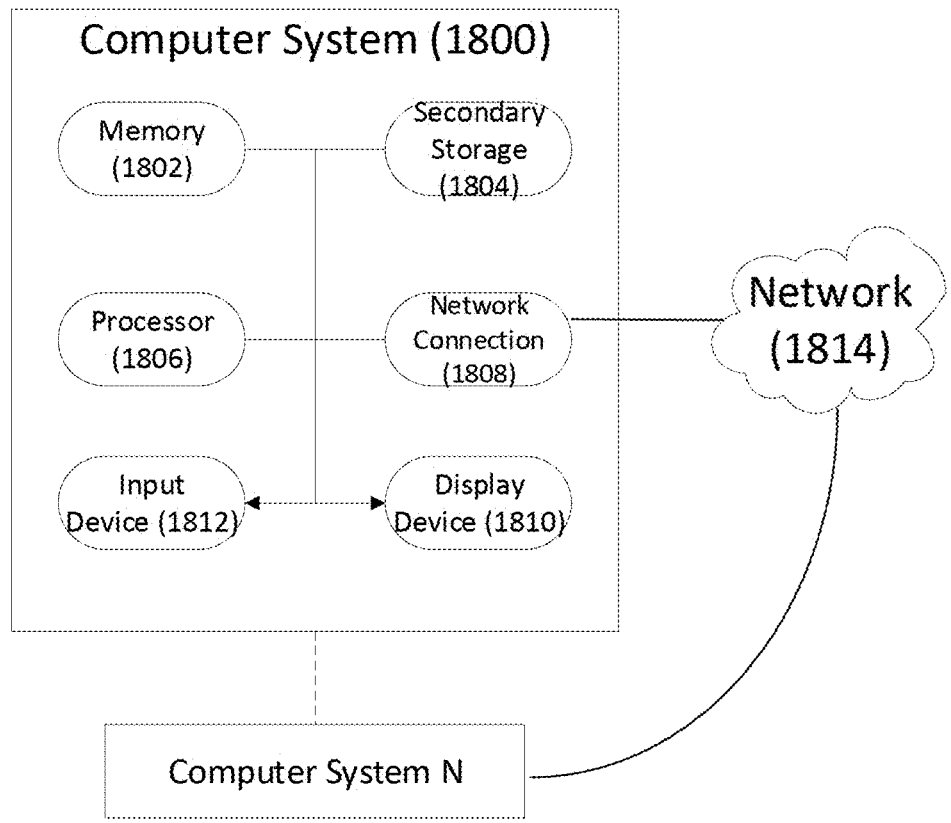
FIG. 18 illustrates exemplary hardware components for a server.

FIG. 18 illustrates exemplary hardware components of a PDC or a computer system. A computer system 1800, or other computer systems similarly configured, may include and execute one or more subsystem components to perform functions described herein, including the steps of various flow processes described above. Likewise, a mobile device, a cell phone, a smartphone, a laptop, a desktop, a notebook, a tablet, a wearable device, a server, etc., which includes some of the same components of the computer system 1800, may run an application (or software) and perform the steps and functionalities described above. Computer system 1800 may connect to a network 1814, e.g., Internet, or other network, to receive inquiries, obtain data, and transmit information and incentives as described above.

The computer system 1800 typically includes a memory 1802, a secondary storage device 1804, and a processor 1806. The computer system 1800 may also include a plurality of processors 1806 and be configured as a plurality of, e.g., bladed servers, or other known server configurations. The computer system 1800 may also include a network connection device 1808, a display device 1810, and an input device 1812.

The memory 1802 may include RAM or similar types of memory, and it may store one or more applications for execution by processor 1806. Secondary storage device 1804 may include a hard disk drive, floppy disk drive, CD-ROM drive, or other types of non-volatile data storage. Processor 1806 executes the application(s), such as those described herein, which are stored in memory 1802 or secondary storage 1804, or received from the Internet or other network 1814. The processing by processor 1806 may be implemented in software, such as software modules, for execution by computers or other machines. These applications preferably include instructions executable to perform the system and subsystem component functions and methods described above and illustrated in the FIGS. herein. The applications preferably provide graphical user interfaces (GUIs) through which users may view and interact with subsystem components.

The computer system 1800 may store one or more database structures in the secondary storage 1804, for example, for storing and maintaining the information necessary to perform the above-described functions. Alternatively, such information may be in storage devices separate from these components.

Also, as noted, processor 1806 may execute one or more software applications to provide the functions described in this specification, specifically to execute and perform the steps and functions in the process flows described above. Such processes may be implemented in software, such as software modules, for execution by computers or other machines. The GUIs may be formatted, for example, as web pages in HyperText Markup Language (HTML), Extensible Markup Language (XML) or in any other suitable form for presentation on a display device depending upon applications used by users to interact with the computer system 1800.

The input device 1812 may include any device for entering information into the computer system 1800, such as a touch-screen, keyboard, mouse, cursor-control device, microphone, digital camera, video recorder or camcorder. The input and output device 1812 may be used to enter information into GUIs during performance of the methods described above. The display device 1810 may include any type of device for presenting visual information such as, for example, a computer monitor or flat-screen display (or mobile device screen). The display device 1810 may display the GUIs and/or output from sub-system components (or software).

Examples of the computer system 1800 include dedicated server computers, such as bladed servers, personal computers, laptop computers, notebook computers, palm top computers, network computers, mobile devices, or any processor-controlled device capable of executing a web browser or other type of application for interacting with the system.

Although only one computer system 1800 is shown in detail, system 1800 may use multiple computer systems or servers as necessary or desired to support the users and may also use back-up or redundant servers to prevent network downtime in the event of a failure of a particular server. In addition, although computer system 1800 is depicted with various components, one skilled in the art will appreciate that the system can contain additional or different components. In addition, although aspects of an implementation consistent with the above are described as being stored in a memory, one skilled in the art will appreciate that these aspects can also be stored on or read from other types of computer program products or computer-readable media, such as secondary storage devices, including hard disks, floppy disks, or CD-ROM; or other forms of RAM or ROM. The computer-readable media may include instructions for controlling the computer system 1800, to perform a particular method, such as methods described above.

The present disclosure is not to be limited in terms of the particular embodiments described in this application, which are intended as illustrations of various aspects. Many modifications and variations can be made without departing from its spirit and scope, as may be apparent. Functionally equivalent methods and apparatuses within the scope of the disclosure, in addition to those enumerated herein, may be apparent from the foregoing representative descriptions. Such modifications and variations are intended to fall within the scope of the appended representative claims. The present disclosure is to be limited only by the terms of the appended representative claims, along with the full scope of equivalents to which such representative claims are entitled. It is also to be understood that the terminology used herein is for the purpose of describing particular embodiments only, and is not intended to be limiting.

What is claimed is:

1. A method comprising:

receiving, at a processor of a phasor data concentrator (PDC), input data from a phasor measurement unit ("PMU");

calculating, using the processor, a slope for each data point in the input data, wherein the slope of each data point $k_i$ is calculated as follows:

$$k_i = \left| \frac{|X_{i+1}| - |X_i|}{t_{i+1} - t_i} \right| \qquad (1)$$

generating, using the processor, an output of a decision tree as a binary classification model, wherein the processor is configured to:

set a depth p and a threshold of information gain ratio $\varepsilon$;

calculate (2) a gain ratios of features (a, b, c, d) for each data point, wherein the gain ratio of a feature b is calculated as follows:

$$o(D, b, s_i) = \frac{O(D, b, s_i)}{I(b)} \qquad (5)$$

$$I(b) = -\sum_{\beta \in \{-,+\}} \frac{|D_{s_i}^\beta|}{|D|} \log_2 \frac{|D_{s_i}^\beta|}{|D|} \qquad (6)$$

where I(b) is the intrinsic value;

select (2) a largest gain ration to compare with $\varepsilon$;

if the gain ration is greater than $\varepsilon$, use (3) a corresponding feature as a feature of the first division;

place (4) data $X_i$ whose feature $b_i \leq s_b$ in a first collection; and place (5) the data $X_i$ whose feature $b_i > s_b$ in a second collection; and if the gain ration is less than $\varepsilon$, repeat the above steps (1)-(5) recursively up to p times until labels of data in one of the first collection and the second collection are the same;

determine, using the processor and the output, whether a test data D' contains a step point;

filter, using the processor, an amplitudes of data points before the step point occurs and an amplitudes of data points after the step point occurs using a $3\sigma$ rule, as follows:

$$P(||X_i|-\mu|\leq 3\sigma)\leq 99.73\% \qquad (8)$$

where $\mu$ represents the mean value of the amplitudes, and $\sigma$ is the standard deviation of the amplitudes;

construct a Laplacian matrix L:

$$L=D_d-W \qquad (15)$$

wherein a similarity matrix W is established according to a similarity between any two data points, and the similarity of any two data points is defined as follows:

$$\omega_{ij} = \begin{cases} \exp\left(-\frac{\|r_i - r_j\|^2}{\delta^2}\right), & i \neq j \\ 0, & i = j \end{cases} \quad (13)$$

where $\delta$ is a scale parameter;

wherein a degree matrix $D_d$ is a diagonal matrix as follows:

$$D_d = \begin{bmatrix} d_1 & & & \\ & d_2 & & \\ & & \ddots & \\ & & & d_{n-1} \\ & & & & d_n \end{bmatrix}, d_i = \sum_{j=1}^{n} \omega_{ij} \quad (14)$$

Decompose, using the processor, eigenvalues of the Laplacian matrix L to find smallest m eigenvectors, wherein a minimum value of the following is equal to a sum of the m smallest eigenvalues of the Laplacian matrix L:

$$\begin{cases} \min_{H \in \square^{n \times k}} Tr(H^T L H) \\ \text{s.t.} \quad H^T H = I \end{cases} \quad (22)$$

construct, using the processor, a matrix F composed of eigenvectors corresponding to a minimum m eigenvalues of the Laplacian matrix L;

calculate, using the processor, $C_1$ which contains normal data, and $C_2$ which contains bad data using use K-means to cluster the matrix F;

output, using the processor, $C_1$ and $C_2$; and transmit, from the PDC using the processor, $C_1$ and $C_2$ to a server at a power station to:

correct the input data using a recovery method;
monitor an operating status of a power system; and
perform closed-loop control on the power system.

* * * * *